US012794485B2

(12) United States Patent
Seyed Aliroteh et al.

(10) Patent No.: US 12,794,485 B2
(45) Date of Patent: Nov. 10, 2026

(54) TIME-INTERLEAVED ANALOG-TO-DIGITAL CONVERTER

(71) Applicant: TEXAS INSTRUMENTS INCORPORATED, Dallas, TX (US)

(72) Inventors: Seyed Miaad Seyed Aliroteh, Kirkland, WA (US); Baher S. Haroun, Allen, TX (US); Brian P. Ginsburg, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 138 days.

(21) Appl. No.: 18/981,222

(22) Filed: Dec. 13, 2024

(65) Prior Publication Data

US 2026/0172043 A1 Jun. 18, 2026

(51) Int. Cl.
*H03M 1/12* (2006.01)

(52) U.S. Cl.
CPC ........... *H03M 1/1215* (2013.01); *H03M 1/12* (2013.01); *H03M 1/121* (2013.01)

(58) Field of Classification Search
CPC ....... H03M 1/12; H03M 1/121; H03M 1/1215
See application file for complete search history.

(56) References Cited

U.S. PATENT DOCUMENTS 7,015,729 B1 * 3/2006 Tursi .................... G11C 27/024 327/94
10,855,302 B2 * 12/2020 Ali ...................... H03M 1/1033

OTHER PUBLICATIONS

DICKSON; et al., "A 12-GB/s 11-mW Half-Rate Sampled 5-Tap Decision Feedback Equalizer With Current-Integrating Summers in 45-nm Soi Cmos Technology", IEEE Journal of Solid-State Circuits, vol. 44, No. 4, Apr. 2009, pp. 1298-1305, 8 p.
NAVID; et al., "A 40 GB/s Serial Link Transceiver in 28 nm CMOS Technology", IEEE Journal of Solid-State Circuits, vol. 50, No. 4, Apr. 2015, pp. 814-827, 14 p.
WU; et al., "70 GHz Large-signal Bandwidth Sampler Using Current-mode Integrate-and-Hold Circuit in 130 nm SiGe BiCMOS Technology", IEEE Asia-Pacific Microwave Conference (APMC), 2019, pp. 1697-1699, 3 p.
YUAN; et al., "A 25Gb/s Serial-Link Repeater With Receiver Equalization and Transmitter De-emphasis in 0.13um SiGe BiCMOS", IEEE 60th International Midwest Symposium on Circuits and Systems (MWSCAS), 2017, 4 pages.

* cited by examiner

*Primary Examiner* — Khai M Nguyen
(74) *Attorney, Agent, or Firm* — Zhenhai Fu; Charles F. Koch

(57) ABSTRACT

An integrated circuit comprises a plurality of integrate-and-hold circuits coupled to a differential input pair, a plurality of analog-to-digital converters (ADCs), and a processing circuit coupled to the plurality of ADCs. Different integrate-and-hold circuits of the plurality of integrate-and-hold circuits are time-interleaved to integrate and hold a differential input signal from the differential input pair during different time periods. Each ADC of the plurality of ADCs is coupled to at least one integrate-and-hold circuit of the plurality of integrate-and-hold circuits and is configured to convert an output signal of the at least one integrate-and-hold circuit into digital data. The processing circuit is configured to arrange the digital data from the plurality of ADCs and output the arranged digital data via one or more digital output channels.

25 Claims, 19 Drawing Sheets

TIME-INTERLEAVED ANALOG-TO-DIGITAL CONVERTER

BACKGROUND

High-speed analog and digital signals may suffer from signal distortion on the communication channel between a transmitter and a receiver, in particular, when the signal path has a long, lossy physical channel that may include some impedance discontinuities, as in many servers and storage systems. The signal distortion may include linear and non-linear distortions such as frequency-dependent and frequency-independent signal attenuation by the transmission media, noise, crosstalk, harmonic distortion, reflection due to impedance mismatching, electromagnetic interference, distortions caused by power distribution network noise, and the like. The signal distortion may increase the bit error rate of digital systems, or decrease the linearity, signal-to-noise and distortion ratio (SINAD), and spurious-free dynamic range (SFDR) of analog systems. Signal conditioning circuits, such as retimers or redrivers, may be used in some systems to at least partially correct the distortions to high speed electrical signals. However, many systems may not be able to achieve both high speed and high signal integrity (e.g., high linearity) even if some signal conditioning circuits are used.

SUMMARY

This summary is provided to introduce examples of disclosed concepts in a simplified form, which are further described below in the Detailed Description including the drawings provided.

According to certain aspects, an integrated circuit includes a plurality of integrate-and-hold circuits coupled to a differential input pair, where different integrate-and-hold circuits of the plurality of integrate-and-hold circuits are time-interleaved to integrate and hold a differential input signal from the differential input pair during different time periods. The integrated circuit may also include a plurality of analog-to-digital converters (ADCs), each ADC of the plurality of ADCs coupled to at least one integrate-and-hold circuit of the plurality of integrate-and-hold circuits and configured to convert an output signal of the at least one integrate-and-hold circuit into digital data. The integrated circuit may further include a processing circuit coupled to the plurality of ADCs and configured to arrange the digital data from the plurality of ADCs and output the arranged digital data via one or more digital output channels.

According to certain aspects, an integrated circuit may include a plurality of integrate-and-hold circuits coupled to a differential input pair, a first plurality of buffers coupled to the plurality of integrate-and-hold circuits, a plurality of multiplexers, and a second plurality of buffers coupled to differential outputs of the plurality of multiplexers. Different integrate-and-hold circuits of the plurality of integrate-and-hold circuits may be time-interleaved to integrate and hold a differential input signal from the differential input pair during different time periods. Each multiplexer of the plurality of multiplexers may be coupled to two or more buffers of the first plurality of buffers.

The foregoing summary outlines rather broadly various features of examples of the present disclosure so that the following detailed description may be better understood. Additional features and advantages of such examples will be described hereinafter. This summary is neither intended to identify key or essential features of the claimed subject matters, nor is it intended to be used in isolation to determine the scope of the claimed subject matters. The subject matters should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative examples are described in detail below with reference to the following figures.

Figure 1:
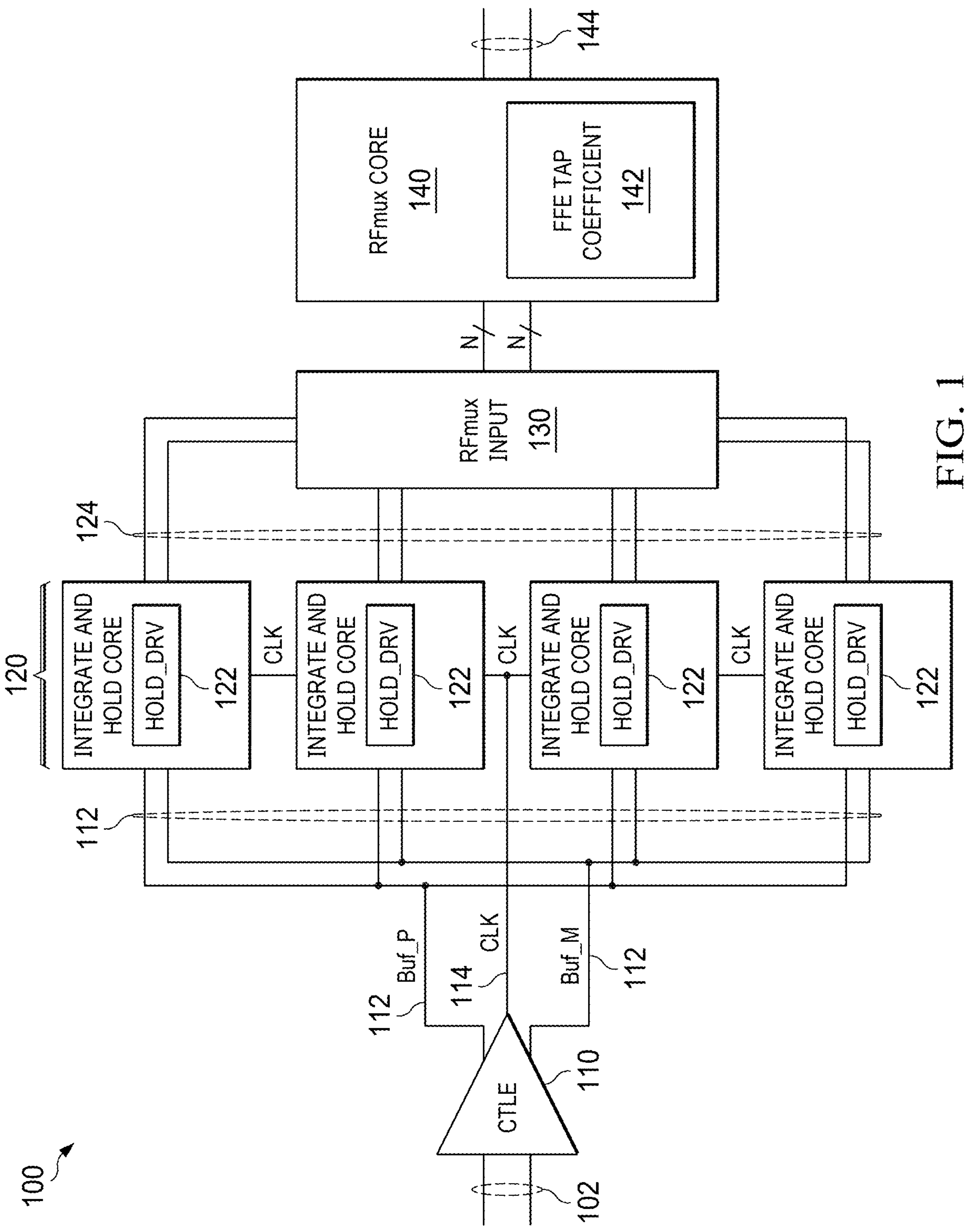
FIG. 1 is a block diagram of an example of a linear retimer.

The drawings and accompanying detailed description are provided for understanding of features of various examples and do not limit the scope of the appended claims. The examples illustrated in the drawings and described in the accompanying detailed description may be readily utilized as a basis for modifying or designing other examples that are within the scope of the appended claims. One skilled in the art will readily recognize from the following description that alternative embodiments of the structures and methods illustrated may be employed without departing from the principles, or benefits touted, of this disclosure. Identical reference numerals may be used, where possible, to designate identical elements that are common among drawings. The figures are drawn to clearly illustrate the relevant elements or features and are not necessarily drawn to scale.

DETAILED DESCRIPTION

The present disclosure relates generally to high speed signal conditioning. According to some examples, a high speed, high linearity integrate-and-hold circuit is disclosed. The integrate-and-hold circuit may be used in systems such as a high speed analog-to-digital converter (ADC) and signal conditional circuits such as a retimer or a serializer/deserializer (SERDES). Examples of retimers and ADCs that utilize the integrate-and-hold circuit are also disclosed herein.

In high-speed digital or analog systems, signal conditioning circuits may be used to improve signal integrity, such that a digital system may have a low bit error rate at a high data rate, while an analog system may have minimum distortion to an analog signal being transported and/or processed. For example, a redriver may be an analog device that may be used to extend the bandwidth of a transmission channel by boosting the high-frequency components of an analog signal (or the analog waveform of a digital signal) to counteract the frequency-dependent attenuation caused by the interconnect, package, system board, connectors, and so on. Thus, the input and output of a redriver may be continuous-time signals with continuous amplitudes. A redriver may compensate for inter-symbol interference (ISI), but may not be protocol aware and may be unable to store received signals or data, and may cause a small signal delay and add some jitter. On the other hand, a retimer may be a mixed-signal device that may include a circuit for converting an incoming bit stream (e.g., digital bits having an analog waveform) into digital bits that can be stored internally, and a circuit for retransmitting the digital data anew. A retimer may have a clock data recovery (CDR) circuit. The input and output of a retimer can be discrete-time signals (e.g., samples at discrete time points) having discrete amplitudes. Since a retimer may re-establish the signal shape and jitter of a received signal, it can also extend the reach of a transmission channel, and may allow a longer reach than a redriver because it may not suffer from jitter accumulation. But retimers may be more complex, more expensive, and physically larger than redrivers. The design of a retimer may compromise between speed (or bandwidth) and linearity for a given technological node or fabrication process, such as operating at a lower speed for better linearity or sacrificing linearity to achieve a high speed.

Some examples disclosed herein relate to linear retimer architectures that may push the speed-linearity trade-off curve towards both higher speed and higher linearity by improving both the speed and the linearity at higher speed. The linear retimer may receive signals (discrete-time or continuous-time) having continuous amplitudes, and transmit discrete-time signals having continuous amplitudes. The linear retimer disclosed herein may utilize high speed and high linearity integrate-and-hold circuits, transmission line buffers that has impedance matching input and can drive multiple output channels, high speed and high linearity finite impulse response (FIR) filters (e.g., feedforward equalizers (FFEs)), and high speed, high linearity, and low crosstalk multiplexers, and the like, to achieve high speed and high linearity at the same time. The integrate-and-hold circuits, FIR filters, and multiplexers may include some similar circuits or features that can achieve high speed high-linearity switching, low noise, large and fast signal swings, and low undesired signal coupling or crosstalk.

In one example, a linear retimer disclosed herein may include a plurality of integrate-and-hold circuits that may be time-interleaved to integrate an input signal during different time periods and hold the integrated signals during different time periods. Each integrate-and-hold circuit may operate in three phases during an operating cycle (e.g., an integrate-and-hold cycle). The three phases may include, for example, a clear (or reset) period having a length equal to or less than one cycle (e.g., a clock cycle or another time frame, such as an integrate phase), an integrate phase having a duration about one cycle, and a hold phase having a duration about L cycles, where L can be equal to or larger than one. Therefore, each integrate-and-hold circuit may integrate the input signal once every L+2 cycles (a sum of the clear phase, the integrate phase, and the hold phase), and M integrate-and-hold circuits may be time-interleaved to integrate the input signal in a round-robin manner, such that the input signal may be integrated in each cycle, and M equals L+2. The output of each integrate-and-hold circuit may be sent to L FIR filters (e.g., filter taps formed by FFEs or other weighted summing buffers) of M FIR filters by a 1-to-L distribution buffer. Each of the M FIR filters may be an L-to-1 summing buffer with programmable summing coefficients and may generate an output that is the weighted sum of the outputs of L integrate-and-hold circuits. An M-to-1 multiplexer may be used to selectively send the outputs from the M FIR filters in a round-robin manner to an output channel of the linear retimer. Because the FIR filters are implemented by combining time-delayed, integrate-and-hold analog signal samples from multiple integrate-and-hold circuits, the linear retimer architecture disclosed herein may perform retiming based on analog signal processing, without performing digitization or digital signal processing. In addition, feedback loops may be used to implement infinite impulse response (IIR) filters that may be only limited by the delay or latency for stability.

As described above, sample-and-hold or integrate-and-hold circuits may be used to receive and sample input signals in ADCs and signal conditioning circuits such as a retimer or a SERDES. An integrate-and-hold circuit may have lower noise than a sample-and-hold circuit due to the signal integration. Since the sample-and-hold or integrate-and-hold circuit may often be a front-end stage of a system, the speed (or bandwidth) and linearity of the sample-and-hold or integrate-and-hold circuit may limit the speed/bandwidth and linearity of the entire system. The integrate-and-hold circuits disclosed herein may achieve both high speed and high linearity, and thus may improve both the speed and the linearity of retimers and ADCs.

In one example, the integrate-and-hold circuit disclosed herein may receive an input signal (e.g., a differential input signal) and control signals generated by control circuits, such as a clear (or reset) signal and a HOLD signal. The integrate-and-hold circuit can represent a three-port network as a combined differential pair of transistors with emitter/source degeneration for linearization. The first and second ports (e.g., port-1 and port-2) can be connected to the emitter/sources of the differential pair responsive to receiving the HOLD signal at the third port (e.g., port-3) to deactivate the differential pair of transistors. The differential pair of transistors also have a network of resistors and/or capacitors coupled between the emitters/sources of the differential pairs of transistors to provide emitter/source degeneration to improve linearity and bandwidth.

Specifically, in each integrate-and-hold cycle, the HOLD signal and the clear signal may be active or asserted in a clear (reset) period to clear previously integrated signal on a pair of integration capacitors and set the pair of integration capacitors to known voltage levels, such as a supply volage level at both terminals of each capacitor or a zero voltage across each capacitor. With HOLD signal asserted (or deasserted if it is active low), the pair of transistors can be disabled/deactivated. After a time period (e.g., about a half of a clock cycle), the clear signal may be deactivated while the HOLD signal may remain active, such that clear switches may be fully switched off and any fluctuations on the integration capacitors may be allowed to settle down. After the settling period, the HOLD signal may be deactivated (e.g., deasserted, or asserted if active low), such that the pair of transistors may be activated to charge or discharge the integration capacitors with currents that may be a linear function of the differential input signal. Therefore, a charge difference and hence a voltage difference between the two integration capacitors may be proportional to the differential input signal. After a pre-determined integrate phase, the HOLD signal may be reasserted or reactivated, thereby deactivating the pair of transistors and stopping the integration of the input signal. Since a differential input signal may be applied to the control terminals (e.g., bases or gates) of the pair of transistors, the voltage levels at the two control terminals may be different. As such, when switching from the integrate phase to the hold phase, or from the clear phase to the integrate phase, the two transistors may be deactivated or reactivated at different time according to different switching profiles that may be a function of the input signal. Therefore, the two integration capacitors may be charged or discharged during slightly different time periods, which may be input voltage dependent, and thus the integrated signal may have a high non-linearity. When the speed (or sample rate) increases, the integrate phase may reduce. To improve linearity, the activation/reactivation time can be reduced, so that the time difference between the input-dependent deactivation or reactivation time of the two transistors may remain a relatively low percentage of the integrate phase.

According to some examples, the control signals generated by the control circuits may have a high switching speed (e.g., large swing, high slew rate, and short rising/falling edges) for fast and linear reset and/or fast deactivation/reactivation of the transistors for input signal integration, and may also have prolonged stable high/low output levels for long hold phases and/or short clear phases. A HOLD signal generated by the control circuits may be used to control a switch (or a pair of switches) between a reference terminal (e.g., a voltage supply terminal, power terminal, a ground terminal, etc.) and a bias terminal for biasing terminals (e.g., emitters or sources) of the pair of transistors. The bias terminal may be coupled to the emitters or sources of the pair of transistor through a direct current (DC) bias path that may include a pair of resistors and through an optional alternating current (AC) bias path that may include a pair of capacitors and a pair of resistors coupled between the emitters/sources of the pair of transistors to provide source/emitter degeneration to improve linearity and bandwidth. The AC path can shape the frequency response of the integrate-and-hold circuit by, for example, boosting the gain of the circuit at a high frequency. When activated, the HOLD signal may cause the emitters or sources of both transistors to be quickly biased to a common DC voltage, such that the pair of transistors may be quickly and linearly deactivated and would not charge or discharge the integration capacitors, thereby achieving a high linearity at high speed. Similarly, the pair of transistors may also be quickly and linearly reactivated by disconnecting the emitters or sources of the pair of transistors from the common DC voltage.

Compared with a case where the differential pair of transistors is disabled (or enabled) by disconnecting (or connecting) the inputs of the transistors from the input signals using a pair of switches, connecting the sources/emitters of the differential pair of transistors to a common DC bias voltage can improve the speed of disabling the transistors and reducing the bandwidth degradation that may otherwise by caused by the pair of switches at the inputs. The degeneration network can also be matched between the sources/emitters of the pair of transistors, which allow same amount of charge to be injected into the pair of hold capacitors (as common mode noise) during the transition of the HOLD signal. The AC path can also speed up the movement of common mode noise charge during the transition of the HOLD signal. All these can reduce error in the differential signal provided by the integrate-and-hold circuit caused during the transition into and out of the hold phase and improve the performance of the integrate-and-hold circuit.

In some examples, the resistance of each resistor of the pair of resistors in the DC bias path may be between about one time and ten times of the emitter/source impedance of each transistor of the pair of transistors across a target frequency range. In addition, in some examples, a passive impedance network may be used at the emitter/source of each transistor of the pair of transistors to reduce effective noise. In some examples, cross-coupled neutralization capacitors may be used to reduce undesired charge injection and coupling through parasitic capacitors (e.g., parasitic capacitance between the base/gate and collector/drain) of the transistors.

The linearity and speed of the FIR filters and the multiplexer of the linear retimer may also be improved using similar and/or additional techniques. For example, a multiplexer may deselect an input by clamping/pulling down the input, disconnecting a bias current, and/or increasing a bias voltage level, to reduce undesired coupling from the deselected input to the output of the multiplexer. In some examples, cross-coupled neutralization capacitors may be used to reduce undesired coupling from the deselected input to the output of the multiplexer through parasitic capacitors of the transistors. In some examples, linearization resistors may be used at emitters/sources of the transistors for emitter degeneration and linearity improvement.

The linear retimer architectures disclosed herein may be modified and used for time-interleaved ADCs with high speed and high linearity. For example, the integrate-and-hold circuits disclosed herein may be time-interleaved to integrate and hold an analog input signal to achieve high speed and high linearity. The FIR filters or the multiplexer of the linear retimer may be configured and used as multiplexers to output the integrated signals from two or more integrate-and-hold circuits onto a same output channel. The architectures and components of the linear retimers and time-interleaved ADCs that may utilize the integrate-and-hold circuits disclosed herein are described in more detail below, including the integrate-and-hold circuits, control circuits for generating control signals to control the integrate-and-hold circuits, transmission line buffers, FFE taps, multiplexers, and the like.

Various features are described hereinafter with reference to the figures. An illustrated example may not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations.

Various examples are described herein. Although the specific examples may illustrate various aspects of the above generally described features, examples may incorporate any combination of the above generally described features (which are described in more detail in examples below). Three dimensional x-y-z axes are illustrated in some figures for ease of reference. Some cross-sectional views of various semiconductor devices herein may be general depictions to illustrate various aspects or concepts concerning such semiconductor devices. More specifically, some drain contact structures illustrated in cross-sectional views may not necessarily accurately depict a structure of such drain contact contacts, except to the extent described herein. The illustrations of those drain contact structures are to illustrate various aspects or concepts concerning those drain contact structures.

In the following description, for the purposes of explanation, specific details are set forth in order to provide a thorough understanding of examples of the disclosure. However, it will be apparent that various examples may be practiced without these specific details. For example, devices, systems, structures, assemblies, integrated circuits, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word “example” is used herein to mean “serving as an example, instance, or illustration.” Any embodiment or design described herein as “example” is not necessarily to be construed as preferred or advantageous over other embodiments or designs.

In many electronic systems (including signal transmission channels), it may be desirable that the amplitude of the output or response of a system may be directionally proportional to the amplitude of the input, regardless of the shape or amplitude of the incoming signal, such that the systems may be linear systems. However, electric signals may suffer from signal distortion (e.g., inter-symbol interference (ISI)) due to different losses (e.g., metal interconnect and dielectric losses) of different frequency components of the electrical signals on a signal channel. Other distortions may be caused by, for example, impedance discontinuities in the channels, such as vias, connectors, and packages. In general, the longer the signal channel, the higher the distortion of the electric signals may be. For continuous analog electrical signals, linear redrivers may be used to correct the distortion in the received analog signals and output corrected analog signals with lower distortion. For high-speed digital signals or mixed-signal signals, retimers may be used to recover the clock, detect and/or store digital data, and retransmit the digital data anew. But retimers may be more complex, more expensive, and physically larger than redrivers, and may not be able to process input signals with continuous amplitudes.

According to some examples, a linear retimer circuit may take samples of an input analog (or high speed digital) signal and provide discrete output signal samples that may have continuous amplitudes and low distortion. The linear retimer architecture disclosed herein may perform retiming based on analog signal processing, without performing digitization or digital signal processing.

FIG. 1 is a block diagram of an example of a linear retimer 100. Linear retimer 100 can be used to compensate the uneven attenuations and/or distortions of the different frequency components of a signal of interest by the signal channel, thereby equalizing the gain of those frequency components provided by linear retimer 100. Linear retimer 100 may receive a distorted input signal 102 that may be a continuous-time (or discrete-time) and continuous-amplitude signal, and provide an equalized output signal that may be a discrete-time continuous-amplitude signal. Linear retimer 100 may include multiple integrate-and-hold circuits that may integrate and hold an input signal during different time periods, where the integrated signals held by the integrate-and-hold circuits may be processed using one or more finite impulse response (FIR) filters, such as one or more multi-tap feedforward equalizers (FFEs), for channel equalization and signal integrity improvement. In the illustrated example, linear retimer 100 includes an input driver such as a continuous time linear equalizer (CTLE) 110, a plurality of integrate-and-hold cores 120, a multiplexer circuit that may include an multiplexer input circuit 130 and a multiplexer core 140.

CTLE 110 may include (or implement) a filter to attenuate low-frequency signal components, amplify components at high frequencies (e.g., around the Nyquist frequency), and/or filter out higher frequency components. CTLE 110 may at least address the gross low-pass filtering effect of the signal channel. The gain of CTLE 110 may be adjusted to balance the low frequency attenuation and high frequency amplification. In some examples, CTLE 110 may include two or more amplification stages, to achieve the desired gain bandwidth. In some examples, the input signal 102 and the output signal 112 of CTLE 110 may be differential signals that may achieve higher amplitude with a lower signal amplitude of each single-end signal and may have lower noises due to, for example, a higher common-mode noise rejection. In some examples, CTLE 110 may include or may be coupled to a clock recovery circuit that can recover a clock signal 114 from the received input signal. The recovered clock signal 114 may be used to generate control signals (e.g., clear and hold signals and multiplexer input selection signals) for controlling other circuits in linear retimer 100, including integrate-and-hold cores 120 and multiplexer core 140.

Output signal 112 (e.g., a differential output signal, also labelled Buf_P and Buf_M in FIG. 1) of CTLE 110 may be coupled to each integrate-and-hold core 120. In each integrate-and-hold cycle, an integrate-and-hold core 120 may clear an integrated signal from the previous cycle in a first time period (clear phase), integrate an input signal in a second time period (integrate phase), and hold the integrated values for a third time period (hold phase). Each integrate-and-hold cycle can include multiple clock cycles, and the hold phase can be more than one clock cycle. When one integrate-and-hold core 120 is in the hold phase, one or more other integrate-and-hold cores 120 may be in the integrate phase or clear phase. The hold time may be selected based on, for example, the number of integrate-and-hold cores 120 in linear retimer 100, and the integration time of each integrate-and-hold core 120. Each integrate-and-hold core 120 may include a clear signal generation circuit that may generate a clear signal for clearing the integrated signal from the previous cycle, for example, based at least in part on the recovered clock signal from CTLE 110. Each integrate-and-hold core 120 may also include a hold drive circuit 122 that may generate control signals for controlling the operations of integrate-and-hold core 120, such as the transitions from the clear phase to the integrate phase and from the integrate phase to the hold phase. The output signal 124 of each integrate-and-hold core 120 may be a differential signal. The differential outputs of each integrate-and-hold core 120 may be coupled to respective differential input ports of multiplexer input circuit 130.

Multiplexer input circuit 130 may include one or more buffers coupled to one or more pairs of differential input ports of multiplexer input circuit 130. Each buffer of the one or more buffer may have an effective input impedance that may match the impedance of the transmission line between the output of each integrate-and-hold core 120 and the multiplexer circuit, such that the transmission line may be properly terminated to reduce reflections that otherwise may be caused by impedance mismatch. For example, the buffer may include termination resistors at the input to achieve a target effective input impedance. Each buffer of multiplexer input circuit 130 may have a low output impedance. Therefore, multiple buffers and transmission lines may be cascaded to form a long signal channel having good impedance matching to achieve a low distortion and/or attenuation on the signal channel. In some examples, each buffer of multiplexer input circuit 130 may include a push-pull transimpedance buffer. In some examples, each buffer of multiplexer input circuit 130 may include a common-mode voltage control circuit such that the common-mode voltage of the output signal of the buffer can be set to a target value that may be same as or different from the common-mode voltage of the input signal of the buffer. In some examples, each buffer may include multiple output ports to distribute the input signal to multiple receiving devices (e.g., FIR filters).

Multiplexer core 140 may include one or more FIR filters such as M instances of FFE taps 142, and an M-to-1 multiplexer, where M is larger than one. Each FFE can implement one tap of the FIR filter. Each FIR filter may sum integrated signals generated in multiple integrate phases based on respective coefficients for the integrated signals (or integrate phases), and output an integrated and equalized signal sample. The multiplexer may selectively provide output samples from the M instances of FIR filters to an output channel 144 of the multiplexer circuit in a round-robin manner, such that output channel 144 may include integrated and equalized signal samples that are arranged in the order that they are integrated. As such, the output signal on the output channel 144 of the multiplexer circuit may be a discrete-time signal (e.g., samples at discrete time points) having a continuous amplitude that may be linearly proportional to the amplitude of input signal 102. In this way, linear retimer 100 may convert a distorted continuous-amplitude input signal 102 (which can be a discrete-time or continuous-time signal) into an equalized discrete-time continuous-amplitude output signal on output channel 144.

Figure 2:
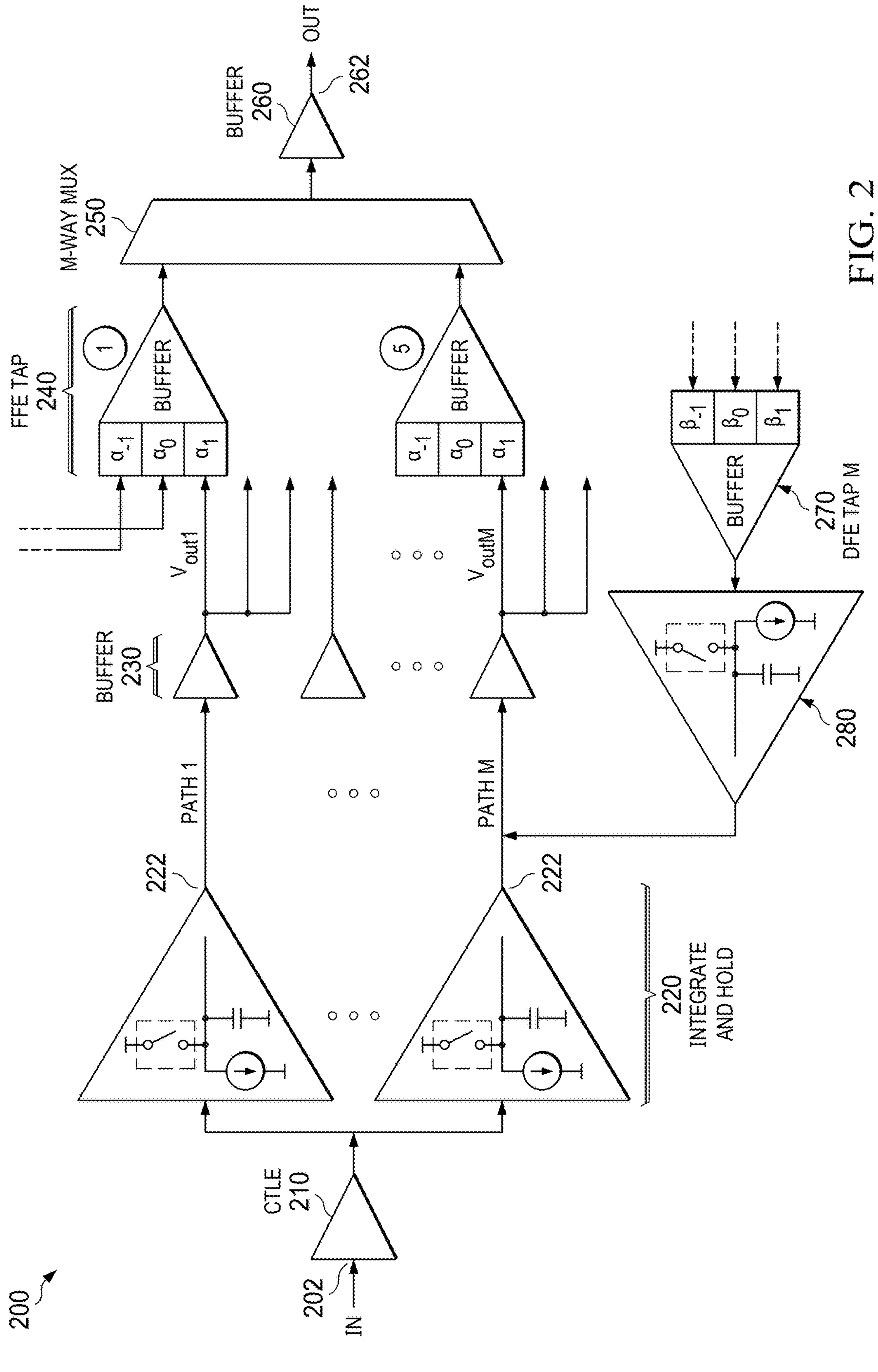
FIG. 2 is a block diagram of another example of a linear retimer.

FIG. 2 is a block diagram of an example of a linear retimer 200. Linear retimer 200 may be an example of linear retimer 100. In the illustrated example, linear retimer 200 may include a CTLE 210 coupled to an input port 202 of linear retimer 200. Input port 202 may represent a pair of differential input ports and may receive a differential input signal having a bandwidth of, for example, a few gigahertz, a few tens of gigahertz, or higher. The output of CTLE 210 may be coupled to a plurality of integrate-and-hold cores 220. Each of integrate-and-hold cores 220 may include an output 222 that may be coupled to a corresponding buffer 230 of a plurality of buffers 230. Each buffer 230 may be an example of the buffer of multiplexer input circuit 130. The output of each buffer 230 may be coupled to two or more FFE taps 240. In the examples shown, there are M instances of integrate-and-hold cores 220. The output of each FFE tap 240 may be coupled to an M-to-1 multiplexer 250, which may be controlled to connect the output of one FFE tap 240 at a time to an output of M-to-1 multiplexer 250 in a round-robin manner. In the illustrated example, linear retimer 200 may include an output buffer 260 that drives an output port 262 of linear retimer 200 using the output of M-to-1 multiplexer 250. In some examples, linear retimer 200 may also include one or more decision feedback equalizer (DFE) taps 270.

As described above with respect to FIG. 1, CTLE 210 may include (or implement) a filter that can attenuate low-frequency signal components, boost components at high frequencies (e.g., around the Nyquist frequency), and/or filter out higher frequency components, such that frequency components in a band of interest may have the same or similar attenuation or amplification to achieve channel equalization, while frequency components outside of the band of interest may be filtered out. CTLE 210 may at least address the gross low-pass filtering effect of a signal channel that may have a limited bandwidth. CTLE 210 may be formed using passive components (e.g., passive filters formed using capacitors and resistors) or active components (e.g., filters formed using transistors). For example, CTLE 210 may include one or more high-pass filters to boost the high frequency components of the received signal. The gain of CTLE 210 may be adjusted to balance the low frequency attenuation and high frequency amplification. In some examples, CTLE 210 may include two or more stages to achieve the desired boost factor and gain bandwidth. The input signal and the output signal of CTLE 210 may be differential signals. Even though not shown in FIG. 2, in some examples, CTLE 210 may include or may be coupled to a clock recovery circuit, such as a clock data recovery (CDR) circuit, which may recover a clock signal from the received input signal. The recovered clock signal may be used to generate control signals for controlling other circuits in linear retimer 200, including integrate-and-hold cores 220 and M-to-1 multiplexer 250, as described in more detail below.

Each integrate-and-hold core 220 may integrate an input signal (e.g., the output signal of CTLE 210) over an integrate phase (e.g., during the integrate phase) and hold the integrated signal for a hold phase (e.g., during the hold phase), thereby generating and temporally storing a signal sample in each integrate-and-hold cycle. At the beginning of each integrate-and-hold cycle, the signal integrated and held during the previous integrate-and-hold cycle may be cleared by, for example, shorting the two terminals of an integration capacitor for a clear phase (e.g., during the clear phase). When the input signal is a differential signal, two integration capacitors may be used for integration and hold, where each integration capacitor may be used to integrate and hold a single-end signal of the differential input signals. In one example, the clear phase (including a settling period) may be one clock cycle of the recovered clock signal or another time frame (e.g., a pre-determined integrate phase). In some examples, the integration capacitors may be allowed to settle for a time period (e.g., about a half of a cycle) during the clear phase. After the signal integrated during the previous integrate-and-hold cycle is cleared and the voltage level of the differential signal stored in the two integration capacitors is reset (e.g., to zero), the input signal may be integrated during the integrate phase by, for example, charging or discharging the two integration capacitors, where the currents for charging or discharging the integration capacitors may be proportional to the input signals (e.g., the two single-end signals of the differential signal). In one example, the integrate phase may be one clock cycle of the recovered clock signal. After the predetermined integrate phase, the charging or discharging of the integration capacitors may be stopped, and the differential voltage signal stored in the two integration capacitors may be held during the hold phase. The hold phase can include one or more clock cycles, such as two or more clock cycles. As described in detail below, each integrate-and-hold core 220 may include circuits designed to achieve high bandwidth and high linearity integration and hold.

In some examples, with linear retimer 200 including a plurality of integrate-and-hold cores 220, different integrate-and-hold cores 220 may be configured to integrate and hold the input signal during different time periods, such as in a round-robin manner. When one integrate-and-hold core 220 is in the hold phase, one or more other integrate-and-hold cores 220 may be in the integrate phase or clear phase. The hold phase may be pre-determined based on, for example, the number of taps in an FIR filter, the number of integrate-and-hold cores 220 in linear retimer 200, and the integration time of each integrate-and-hold core 220. For example, when there are M integrate-and-hold cores 220 and the recovered clock from the input signal at input port 202 has a frequency f (or a period of 1/f), each integrate-and-hold core 220 may integrate and hold once in M clock cycles or M/f seconds, or may have an integrate-and-hold rate of f/M, and may hold the integrated signal for M-2 clock cycles, where each FIR filter may have no more than M-2 taps.

Each integrate-and-hold core 220 may include a clear signal generation circuit that may generate a clear signal by gating a clock signal to control the clearing of the integrated signal from the previous integrate-and-hold cycle. Each integrate-and-hold core 220 may also include a hold drive circuit that may generate a hold signal for controlling the operations of integrate-and-hold core 120, such as the transition from the integrate phase to the hold phase and from clear phase to the integrate phase. The output 222 of each integrate-and-hold core 220 may be a differential signal. The differential output of each integrate-and-hold core 220 may be coupled to a respective buffer 230 (e.g., a differential buffer).

Each buffer 230 may have an effective input impedance based on the impedance of the transmission line between the output of each integrate-and-hold core 220 and the corresponding buffer 230. For example, the impedances may be matched (or matched to within a certain degree), to reduce reflection that may otherwise be caused by impedance mismatch. For example, the buffer may include termination resistors at the input to achieve a target effective input impedance that matches the impedance of the transmission line. Each buffer 230 may have a low output impedance and may drive multiple transmission lines that connect the output of buffer 230 to a plurality of FFE taps 240. In some examples, each buffer 230 may include a push-pull transimpedance buffer. In some examples, each buffer 230 may include a common-mode voltage control circuit such that the common-mode voltage of the output signal of buffer 230 can be set to a target value that may be the same as or different from the common-mode voltage of the input signal from a respective integrate-and-hold core 220.

Each FFE tap 240 may receive inputs from a plurality of buffers 230, and may generate a weighted sum of the inputs. The weights or coefficients for the inputs may be selected to form a FIR filter having a target impulse response or transfer function. Each FFE tap 240 may include an output buffer that may drive the output of the FFE tap, which may be coupled to M-to-1 multiplexer 250.

M-to-1 multiplexer 250 may be controlled by a selection signal to sequentially connect the outputs of the plurality of FFE taps 240 to the output of M-to-1 multiplexer 250 in a round-robin manner. For example, when M=4, in a first round, M-to-1 multiplexer 250 may sequentially connect the output of a first FFE tap 240 to the output of M-to-1 multiplexer 250, connect the output of a second FFE tap 240 to the output of M-to-1 multiplexer 250, connect the output of a third FFE tap 240 to the output of M-to-1 multiplexer 250, and then connect the output of a fourth FFE tap 240 to the output of M-to-1 multiplexer 250. In a second round, M-to-1 multiplexer 250 may again connect the output of the first FFE tap 240 to the output of M-to-1 multiplexer 250, connect the output of the second FFE tap 240 to the output of M-to-1 multiplexer 250, and so on. In some examples, the M-to-1 multiplexer 250 may include circuits similar to the integrate-and-hold circuits and may achieve high bandwidth and high linearity. The output signals of M-to-1 multiplexer 250 may be discrete-time (e.g., samples at different sample time points), have a continuous-amplitude, and equalized to have amplitudes proportional to the amplitude of the input signal. Output buffer 260 may receive the output of M-to-1 multiplexer 250 and drive output port 262, which may be coupled to subsequent circuits in the signal channel through a transmission line.

In some examples, linear retimer 200 may also include one or more decision feedback equalizer (DFE) taps 270, which form an IIR filter and each DFE can implement a tap of the IIR filter. DFE taps 270 may, for example, correct distortion caused by reflection, cancel post-cursor ISI, and boost high frequency content without noise and crosstalk amplification. In the example shown in FIG. 2, there can be M instances of DFE tap 270, where the output of each DFE tap 270 can be fed back to one instance of buffer 230 to correct the distortion. The inputs of each instance of DFE tap 270 are coupled to the outputs of M instances of integrate-and-hold core 220. Each DEF tap 270 can select, out of the M instances of integrate-and-hold core 220, the outputs of L instances of integrate-and-hold core 220 that are in the hold phase, and generate a feedback signal by scaling the signals at the selected outputs of the L instances of integrate-and-hold core 220 with tap coefficients, and summing the scaled signals to generate a weighted sum of the inputs. DFE taps 270 can then provide the feedback signal to the corresponding integrate-and-hold core 220. The feedback signal of each DFE tap 270 may be integrated and held by an integrate-and-hold circuit 280, and fed back to the input to a corresponding buffer 230.

Figure 3:
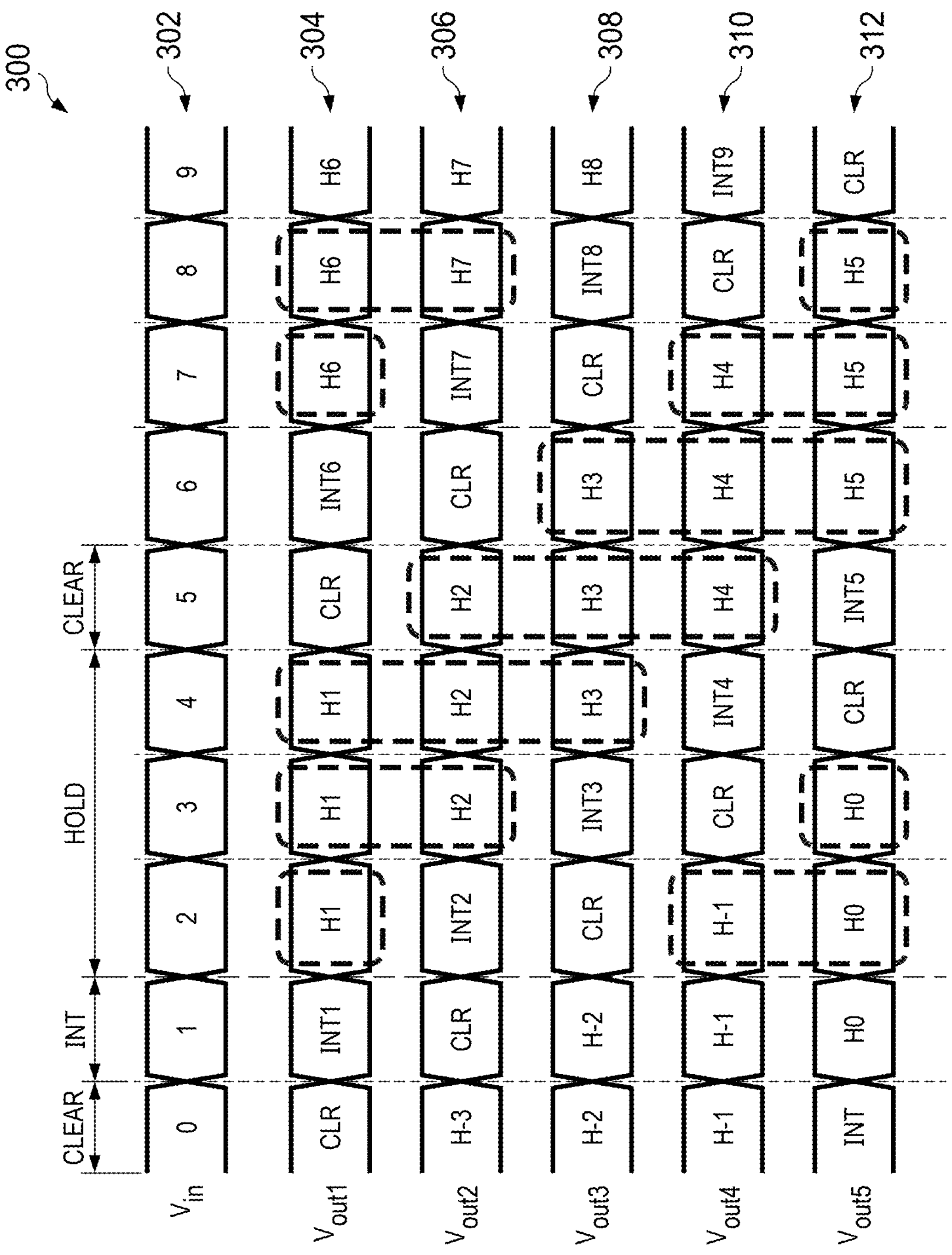
FIG. 3 is a diagram illustrating operations of a plurality of integrate-and-hold cores of an example of a linear retimer during different time periods.

FIG. 3 is a diagram 300 illustrating operations of a plurality of integrate-and-hold circuits of an example of a linear retimer, such as linear retimer 200, during different time periods. In the example of FIG. 3, there can be five instances of integrate-and-hold cores 220 (M=5), and the hold phase has three clock cycles (L=3). Accordingly, at a given clock cycle there can be three integrate-and-hold cores 220 in the hold phase. A diagram 302 shows an example of an input signal $V_{in}$ at an input port of a linear retimer, such as input port 202 of CTLE 210 of linear retimer 200.

Diagrams 304, 306, 308, 310, and 312 show example of outputs of the plurality of integrate-and-hold circuits, such as outputs 222 of integrate-and-hold cores 220. In the illustrated example, each FFE tap may be a 3-tap FFE configured to receive three signals that were integrated in three consecutive periods and held by three integrate-and-hold circuits. Each integrate-and-hold circuit may hold an integrated signal for three integrate phases. The linear retimer may include five integrate-and-hold circuits that may integrate and hold input signal $V_{in}$ in a round-robin manner, where each integrate-and-hold cycle for one integrate-and-hold circuit may include 5 time periods (e.g., 3 time periods for the hold phase, one time period for the clear phase, and one time period for the integrate phase). The numbers in diagram 302 also denote time periods.

For example, in time period 0, the first integrate-and-hold circuit (providing $V_{out1}$) may be in the clear phase, the second to fourth integrate-and-hold circuits (providing $V_{out2}$, $V_{out3}$, and $V_{out4}$) may be in the hold phase, whereas the fifth integrate-and-hold circuit (providing $V_{out5}$) may be in the integrate phase. Therefore, in time period 0, output $V_{out1}$ of the first integrate-and-hold circuit may be a cleared signal (e.g., 0 V), output $V_{out2}$ of the second integrate-and-hold circuit may be an integrated signal that was integrated three integrate phases ago (H-3), output $V_{out3}$ of the third integrate-and-hold circuit may be an integrated signal that was integrated two integrate phases ago (H-2), output $V_{out4}$ of the fourth integrate-and-hold circuit may be an integrated signal that was integrated one integrate phase ago (H-1), and output $V_{out5}$ of the fifth integrate-and-hold circuit may be a varying signal due to the integration of input signal $V_{in}$ during time period 0. During time period 0, an FFE tap 240 may use outputs $V_{out2}$, $V_{out3}$, and $V_{out4}$ to generate an equalized signal.

In time period 1, the first integrate-and-hold circuit may be in the integrate phase, the second integrate-and-hold circuit may be in the clear phase, and the third, fourth, and fifth integrate-and-hold circuits may be in the hold phase. Therefore, in time period 1, output $V_{out1}$ of the first integrate-and-hold circuit may be varying due to the integration of input signal $V_{in}$ in time period 1, output $V_{out2}$ of the second integrate-and-hold circuit may be a cleared signal (e.g., 0V), output $V_{out3}$ of the third integrate-and-hold circuit may be an integrated signal that was integrated three integrate phases ago (H-2), output $V_{out4}$ of the fourth integrate-and-hold circuit may be an integrated signal that was integrated two integrate phases ago (H-1), and output $V_{out5}$ of the fifth integrate-and-hold circuit may be an integrated signal that was integrated in time period 0 (H0). During time period 1, an FFE tap 240 may use outputs $V_{out3}$, $V_{out4}$, and $V_{out5}$ to generate an equalized signal.

In time period 2, the first integrate-and-hold circuit may be in the hold phase, the second integrate-and-hold circuit may be in the integrate phase, the third integrate-and-hold circuit may be in the clear phase, and the fourth and fifth integrate-and-hold circuits may be in the hold phase. Therefore, in time period 2, output $V_{out1}$ of the first integrate-and-hold circuit may be the integrated signal generated in time period 1 (H1), output $V_{out2}$ of the second integrate-and-hold circuit may be varying due to the integration of input signal $V_{in}$, output $V_{out3}$ of the third integrate-and-hold circuit may be a cleared signal, output $V_{out4}$ of the fourth integrate-and-hold circuit may be an integrated signal that was integrated three integrate phases ago (H-1), and output $V_{out5}$ of the fifth integrate-and-hold circuit may be an integrated signal that was integrated in time period 0 (H0). During time period 2, an FFE tap 240 may use outputs $V_{out4}$, $V_{out5}$, and $V_{out1}$ to generate an equalized signal.

In time period 3, the first integrate-and-hold circuit may be in the hold phase, the second integrate-and-hold circuit may be in the hold phase, the third integrate-and-hold circuit may be in the integrate phase, the fourth integrate-and-hold circuit may be in the clear phase, and the fifth integrate-and-hold circuits may still be in the hold phase. Therefore, in time period 3, output $V_{out1}$ of the first integrate-and-hold circuit may be the integrated signal generated in time period 1 (H1), output $V_{out2}$ of the second integrate-and-hold circuit may be the integrated signal generated in time period 2 (H2), output $V_{out3}$ of the third integrate-and-hold circuit may be varying due to the integration of input signal $V_{in}$, output $V_{out4}$ of the fourth integrate-and-hold circuit may be a cleared signal, and output $V_{out5}$ of the fifth integrate-and-hold circuit may be an integrated signal that was integrated in time period 0 (H0). During time period 3, an FFE tap 240 may use outputs $V_{out5}$, $V_{out1}$, and $V_{out2}$ to generate an equalized signal.

In time period 4, the first integrate-and-hold circuit may be in the hold phase, the second integrate-and-hold circuit may be in the hold phase, the third integrate-and-hold circuit may be in the hold phase, the fourth integrate-and-hold circuit may be in the integrate phase, and the fifth integrate-and-hold circuits may be in the clear phase. Therefore, in time period 4, output $V_{out1}$ of the first integrate-and-hold circuit may be the integrated signal generated in time period 1 (H1), output $V_{out2}$ of the second integrate-and-hold circuit may be the integrated signal generated in time period 2 (H2), output $V_{out3}$ of the third integrate-and-hold circuit may be the integrated signal generated in time period 3 (H3), output $V_{out4}$ of the fourth integrate-and-hold circuit may be varying due to the integration of input signal $V_{in}$, and output $V_{out5}$ of the fifth integrate-and-hold circuit may be a cleared signal. During time period 4, an FFE tap 240 may use outputs $V_{out1}$, $V_{out2}$, and $V_{out3}$ to generate an equalized signal.

The operation of the linear retimer in time period 5 may be similar to the operation in time period 0. In time period 5, the first integrate-and-hold circuit may be in the clear phase, the second to fourth integrate-and-hold circuits may be in the hold phase, whereas the fifth integrate-and-hold circuit may be in the integrate phase. Therefore, in time period 5, output $V_{out1}$ of the first integrate-and-hold circuit may be a cleared signal, output $V_{out2}$ of the second integrate-and-hold circuit may be an integrated signal that was integrated in time period 2 (H2), output $V_{out3}$ of the third integrate-and-hold circuit may be an integrated signal that was integrated in time period 3 (H3), output $V_{out4}$ of the fourth integrate-and-hold circuit may be an integrated signal that was integrated in time period 4 (H4), and output $V_{out5}$ of the fifth integrate-and-hold circuit may be varying due to the integration of input signal $V_{in}$. During time period 5, an FFE tap 240 may use outputs $V_{out12}$, $V_{out3}$, and $V_{out4}$ to generate an equalized signal.

The operation of the linear retimer in time period 6 may be similar to the operation in time period 1, such that an FFE tap 240 may use the integrated signals generated in time periods 3-5 and held at outputs $V_{out3}$, $V_{out4}$, and $V_{out5}$ to generate an equalized signal in time period 6. The operation of the linear retimer in time period 7 may be similar to the operation in time period 2, such that an FFE tap 240 may use the integrated signals generated in time periods 4-6 and held at outputs $V_{out4}$, $V_{out5}$, and $V_{out1}$ to generate an equalized signal in time period 7. The operation of the linear retimer in time period 8 may be similar to the operation in time period 3, such that an FFE tap 240 may use the integrated signals generated in time periods 5-7 and held at outputs $V_{out5}$, $V_{out1}$, and $V_{out2}$ to generate an equalized signal in time period 8. In this way, the linear retimer may generate one integrated and equalized signal in each integrate phase using one FFE tap and outputs from three integrate-and-hold circuits.

To achieve a high linearity, low noise, low distortion, high spurious free dynamic range (SFDR), and high bandwidth (or high speed), it is desirable that components of the linear retimer, such as the integrate-and-hold circuits, the multiplexer, the FIR filters, and the buffers, each have high linearity, high speed, low noise, and other characteristics. However, it is challenging to achieve a linear timer with all the desired performance.

For example, for high-speed applications, the input signals may be differential signals. Each high-speed integrate-and-hold circuit may include a differential input pair that includes two input transistors, where the control terminals (e.g., bases or gates) of the two input transistors may be coupled to an input of the differential input pair, respectively. The two input transistors may be coupled to two integration capacitors and a bias circuit (e.g., a current bias circuit). The differential input pair at the two control terminals of the two input transistors may set the two input transistors into linear operating condition, such that the currents passing through the input transistors and charging/discharging the integration capacitors may be linear functions of the voltage levels at the two single ends of the differential input pair. In this way, the two integration capacitors may be charged or discharged according to the differential input signal at the differential input pair, such that the different signal may be integrated and stored as a differential voltage signal between the voltage levels of the two integration capacitors.

To transition from the integrate phase to the hold phase, the two input transistors controlled by the two single ends of the differential input pair may be deactivated to stop charging/discharging the integration transistors. Since the voltage levels at the control terminals of the two input transistors may be different and the voltage levels at the emitters or sources of the two input transistors may be similar, the two input transistors may not be deactivated at the same time, which may result in different switch profiles and different charge injections to the integration capacitors. Similarly, the activated time of the two input transistors may also be input-dependent, and thus the two input transistors may not be activated at the same time at the beginning of the integrate phase due to the differential input pair. Therefore, the integration time may be input dependent and thus may be different between the positive side and the negative side. As such, the integrated differential signal stored as the differential voltage between the two integration capacitors may be distorted and may have a high non-linearity.

According to certain examples, a 3-port linearization technique may be used to apply a strong bias voltage to the emitters or sources of the two input transistors of an integrate-and-hold circuit, such that the two input transistors can be quickly and simultaneously switched off to stop charging or discharging the integration capacitors, thereby improving the linearity of the integrate-and-hold circuit for sampling high frequency input signals at sampling rates at or higher than twice of the highest frequency (or bandwidth) of the input signals. In some examples, the integrate-and-hold circuit disclosed herein may include cross-coupled neutralization capacitors (which may be implemented using transistors with floating terminals) that may cancel the parasitic capacitance between the base and the collector (or between the gate and the drain) of the input transistor on the opposite side to improve equal input charge rejection, SFDR, reverse isolation, power gain, and stability. In some examples, the integrate-and-hold circuit may include current sources coupled to the two input transistors to provide low bias currents to the input transistors such that the input transistors can quickly transition to the linear operating condition after being activated, thereby further improving the bandwidth, linearity, and SFDR of the integrate-and-hold circuit. In some examples, the integrate-and-hold circuit may also include a passive impedance network between the emitter (or source) of each input transistor and ground to reduce noise. In some examples, the integrate-and-hold circuit may include switches for fast and linear reset of the integration capacitors, such that the integration capacitors may be quickly reset to have a target initial voltage level before the integration starts. For example, the two terminals of each integration capacitor may be shorted to a supply voltage level, such that each of the two terminals may be at the supply voltage level and the voltage across each integration capacitor may be set to 0 V.

Figure 4:
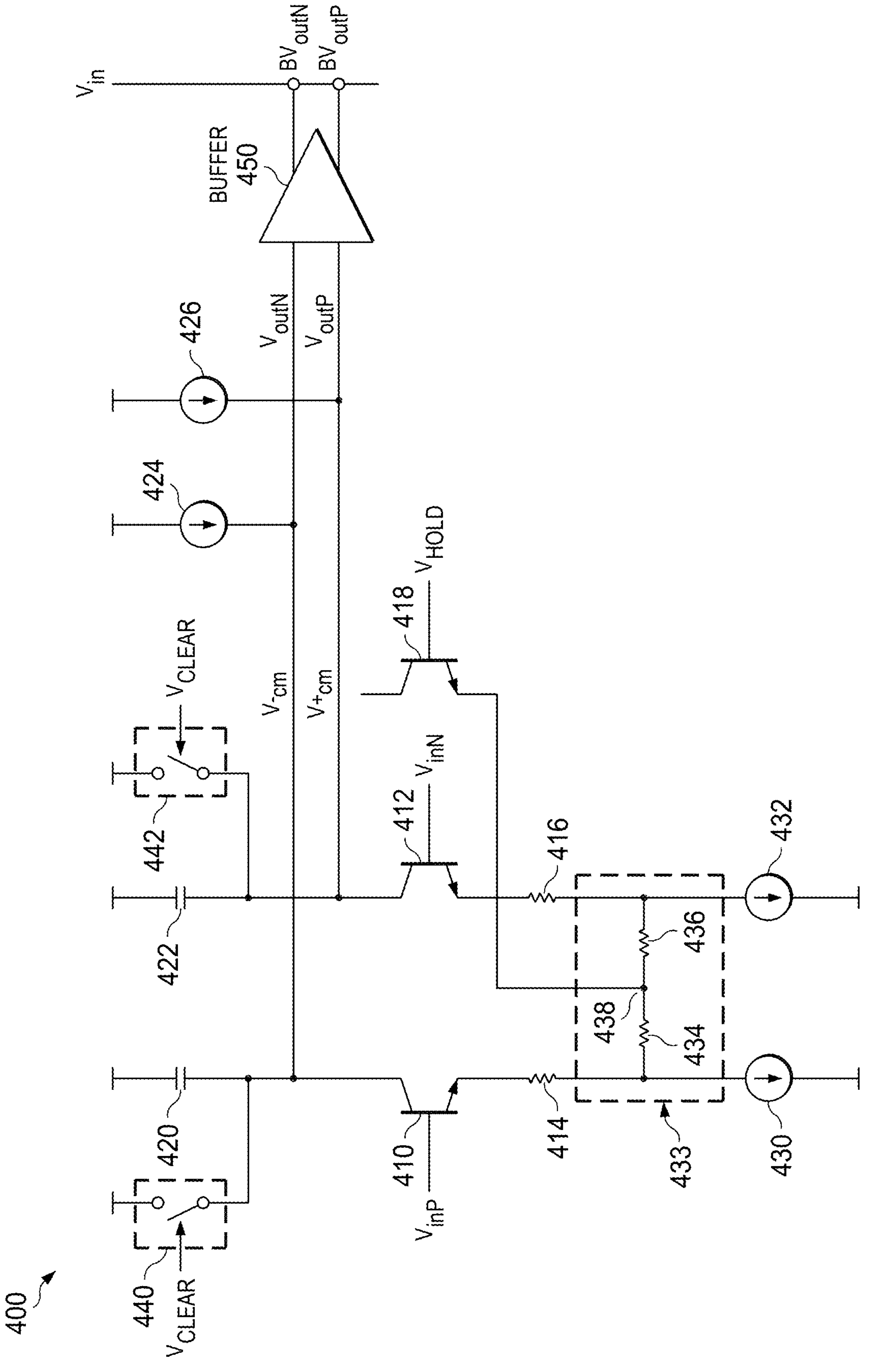
FIG. 4 is a schematic of an example of an integrate-and-hold circuit.

FIG. 4 is a schematic of an example of an integrate-and-hold circuit 400. Integrate-and-hold circuit 400 may be an example of integrate-and-hold core 120 or integrate-and-hold core 220 described above. A buffer 450 shown in FIG. 4 may be a part of integrate-and-hold circuit 400 or may not be a part of integrate-and-hold circuit 400 (e.g., may be an example of buffer 230). In the illustrated example, integrate-and-hold circuit 400 may include a pair of transistors 410 and 412 that may be used as the input transistors. Even though transistors 410 and 412 are shown as bipolar junction transistors (BJTs, e.g., NPN BJTs) in the example illustrated in FIG. 4, transistors 410 and 412 can be other types of transistors such as field effect transistors (FETs) or PNP BJTs in other examples. For example, transistors 410 and 412 may be MOSFETs in some examples. The following description may generally use PNP BJTs as examples.

The bases or gates of the two transistors 410 and 412 may be coupled to a differential input pair, such as the differential output pair of a CTLE (e.g., CTLE 110 or 210). For example, one end (e.g., the positive end $V_{INP}$) of the differential input pair $V_{IN}$ may be coupled to the base or gate of transistor 410, whereas the other end (e.g., the negative end $V_{INN}$) of the differential input pair $V_{IN}$ may be coupled to the base or gate of transistor 412. The collector (or drain) of transistor 410 may be electrically coupled to a first terminal of integration capacitor 420, a current source 424, and a switch 440. A second terminal of integration capacitor 420 may be coupled to a voltage source (e.g., a reference terminal, which can be or coupled to a second voltage supply terminal, a second power terminal, ground, etc.). The emitter (or source) of transistor 410 may be electrically coupled to a current source 430 through a resistor 414. The collector (or drain) of transistor 412 may be electrically coupled to a first terminal of an integration capacitor 422, a current source 426, and a switch 442. A second terminal of integration capacitor 422 may be coupled to the voltage source (e.g., via the reference terminal). The emitter (or source) of transistor 412 may be electrically coupled to a current source 432 through a resistor 416. The collector (or drain) of transistor 410 and the collector (or drain) of transistor 412 may also be electrically coupled to the differential input pair of buffer 450. Transistors 410 and 412 may have some nonlinear transconductance (which may be input-dependent as described in detail below)

and nonlinear parasitic capacitance that may contribute to the nonlinearity (e.g., nonlinear gain) of integrate-and-hold circuit 400.

As described above, when turned on, transistors 410 and 412 may operate under the linear operating condition, such that the differential input signal at differential input pair (labelled $V_{IN}$) may cause a collector (or drain) current of transistor 410 that may be a linear function of the current or voltage level at the positive end $V_{INP}$ of the differential input pair $V_{IN}$, and a collector (or drain) current of transistor 412 that may be a linear function of the current or voltage level at the negative end $V_{INN}$ of the differential input pair $V_{IN}$. The collector (or drain) current of transistor 410 may be at least partially provided from a voltage supply through integration capacitor 420, and thus may charge or discharge integration capacitor 420. Similarly, the collector (or drain) current of transistor 412 may be at least partially provided from the voltage supply through integration capacitor 422, and thus may charge or discharge integration capacitor 422. A small portion of the collector (or drain) current of transistor 410 may be supplied by current source 424 such that transistor 410 may be at a state close to the linear operating condition when it is deactivated, and thus may be more quickly set to the linear operating condition when it is activated to integrate the input signal. Similarly, a small portion of the collector current of transistor 412 may be supplied by current source 426 such that transistor 412 may be at a state close to the linear operating condition when it is deactivated, and thus may be more quickly set to the linear operating condition when it is activated to integrate the input signal. Current source 424 and current source 426 may be part of a current mirror and may have the same current. Switches 440 and 442 may be switched off during the integrate phase and hold phase, but may be switched on during the clear phase to short the two terminals of integration capacitor 420 and the two terminals of integration capacitor 422 to clear the integrated signals and reset integration capacitors 420 and 422. In some examples, the total capacitance of integration capacitor 420 or 422 and any linear parasitic capacitance connected to integration capacitor 420 or 422 may be between about one time and ten times of the total non-linear parasitic capacitance connected to integration capacitor 420 or 422.

On the emitter (or source) side of transistor 410, resistor 414 may be used to reduce noise at the emitter (or source) of transistor 410 and improve the linearity of integrate-and-hold circuit 400 via source/emitter degeneration. The gain of transistor 410 may be reversely proportional to the emitter (or source) resistance, which may include the intrinsic emitter (or source) resistance (e.g., seen into the emitter or source) and external resistance at the emitter (or source). The intrinsic emitter resistance may be the reciprocal of the transconductance of transistor 410, which may be a function of the input signal level. Therefore, the gain of transistor 410 may be different for different input signal levels, and thus may be nonlinear due to the dependency on the input level. Increasing the external serial resistance at the emitter (or source) of transistor 410 may reduce the proportion of the input-dependent intrinsic emitter resistance in the total emitter resistance, and thus may reduce the effect of the input-dependent intrinsic emitter resistance on the gain of transistor 410, thereby improving the linearity of transistor 410. However, increasing the external serial resistance at the emitter of transistor 410 may include the total emitter resistance and thus may reduce the gain of transistor 410, which may be reversely proportional to the emitter resistance. Therefore, increasing the resistance of resistor 414 may increase the noise reduction, improve the stability, and improve the linearity of integrate-and-hold circuit 400, but may reduce the gain of integrate-and-hold circuit 400. In some examples, the resistance of resistor 414 may be between about two times and about five times of the impedance seen at the emitter (or source) of transistor 410 to balance the noise/nonlinearity reduction and gain reduction of integrate-and-hold circuit 400. Similarly, resistor 416 may be used to reduce noise at the emitter (or source) of transistor 412 and improve the linearity of integrate-and-hold circuit 400. Increasing the resistance of resistor 416 may increase the noise reduction and improve the linearity of integrate-and-hold circuit 400, but may reduce the gain of integrate-and-hold circuit 400. In some examples, the resistance of resistor 416 may be between about two times and about five times of the impedance seen at the emitter (or source) of transistor 412 to balance the noise/nonlinearity reduction and gain reduction of integrate-and-hold circuit 400. Current source 430 and current source 432 may be parts of a current mirror and may provide the bias current for transistors 410 and 412, respectively.

When the signal frequency or bandwidth of the input signal is high, the sample rate of the integrate-and-hold circuit may be high according to Nyquist-Shannon sampling theorem. Thus, the integrate phase may be short (e.g., less than 100 ps) for high-speed input signals. As such, it may be desirable that transistors 410 and 412 can be quickly and simultaneously activated and/or deactivated even though they may have different voltage levels at the bases (or gates), in order to improve the linearity of the integrated signal. In the example shown in FIG. 4, integrate-and-hold circuit 400 may include a transistor 418 (or another switch device) and a three-port degeneration network 433 that includes two resistors 434 and 436 coupled to a bias terminal 438. The three-port resistor network may be used for both differential-pair emitter/source degeneration and linear deactivation/reactivation of the differential pair that includes transistors 410 and 412, and thus may improve the linearity of integrate-and-hold circuit 400. Even though FIG. 4 shows transistor 418 as an NPN BJT, transistor 418 may be another type of transistor, such as a MOSFET or a PNP BJT. The collector (or drain) of transistor 418 may be electrically coupled to a voltage source having a certain voltage level, including a ground voltage. The base (or gate) of transistor 418 may be electrically coupled to a control signal $V_{HOLD}$. The emitter (or source) of transistor 418 may be electrically coupled to bias terminal 438. When transistor 418 is turned on, the voltage level at bias terminal 438 may be quickly set to a level close to the base/gate voltages at $V_{inP}$ and $V_{inN}$, thereby quickly switching off or deactivating transistors 410 and 412. On the other hand, when transistor 418 is turned off, bias terminal 438 may be floating and can become a virtual ground for the differential pair of transistors 410 and 412*m* and degeneration network 433 including resistors 434 and 436 can provide emitter/source degeneration for the differential pair of transistors 410 and 412. Also, the electrical path from bias terminal 438 to the source/emitter of each of transistors 410 and 412, through resistors 434 and 436, are matched, which allow the same amount of charge to be injected to integration capacitors 420 and 422 during transition of the HOLD signals as common mode noise charge, which can be cancelled out in the differential signal (difference between $V_{outN}$ and $V_{outP}$) provided by integrate-and-hold circuit 400. All these can improve the performance of integrate-and-hold circuit 400.

Figure 5:
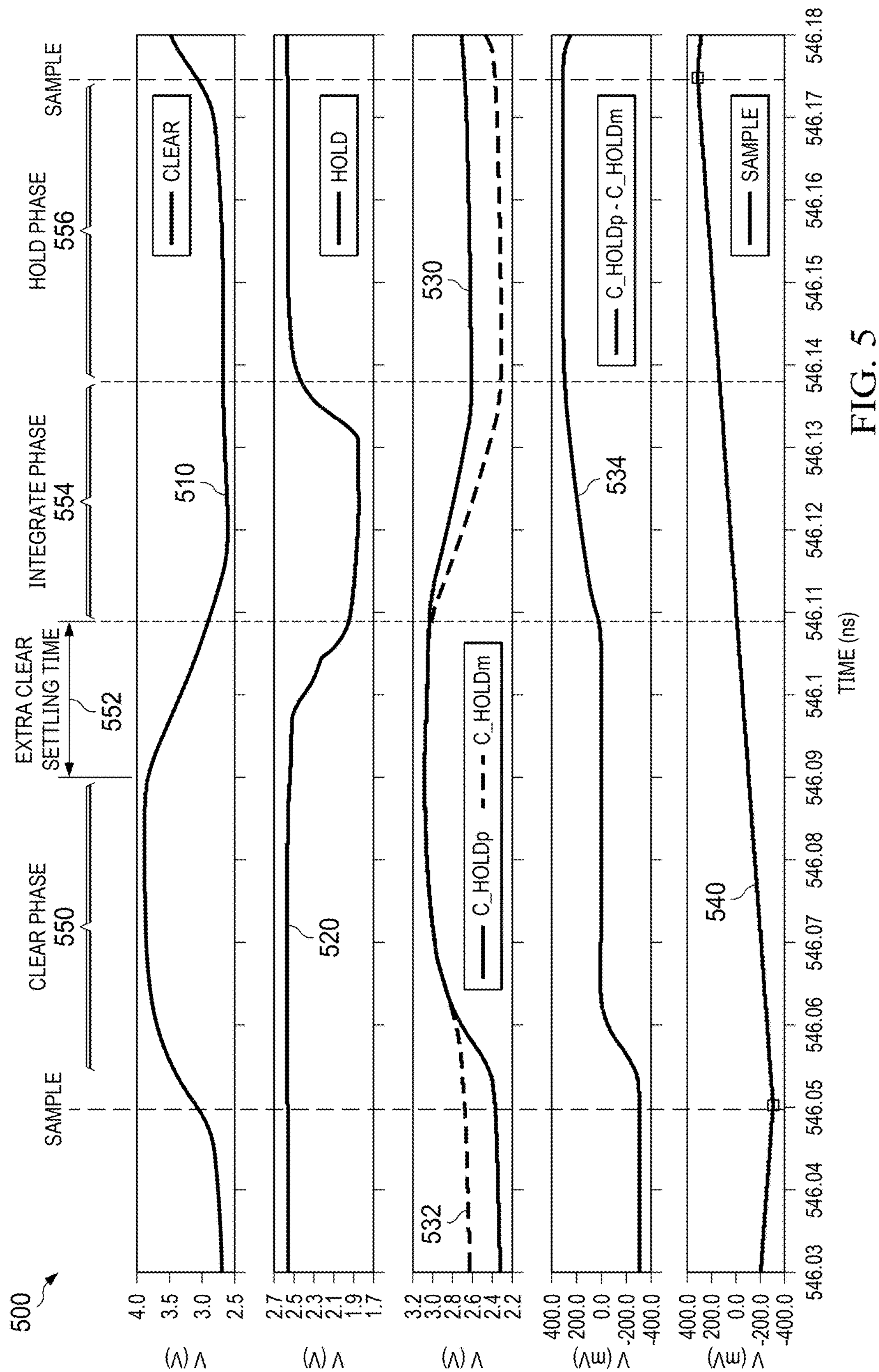
FIG. 5 is a diagram including examples of waveforms of input signals and integrated signals during operations of an example of an integrate-and-hold circuit.

FIG. 5 is a diagram 500 including examples of waveforms of input signals and integrated signals during operations of an example of an integrate-and-hold circuit disclosed herein. In diagram 500, a waveform 510 shows an input signal (e.g., a clear signal) used to control the clear switches (e.g., switches 440 and 442) for clearing the integrated signal stored in the integration capacitors. A waveform 520 shows an input signal (e.g., a hold signal) used to deactivate/reactivate input transistors (e.g., transistors 410 and 412), stop/start the integration of the input signal, and hold the integrated signal in the integration capacitors. Waveforms 530 and 532 show the voltage levels at the terminals (e.g., first terminals) of the two integration capacitors (e.g., integration capacitors 420 and 422) that are coupled to, for example, collectors or drains of the input transistors. A waveform 534 shows a differential signal between the first terminals of the two integration capacitors, which may be a voltage difference between the voltage levels shown by waveforms 530 and 532. A waveform 540 shows an example of an input signal that is being integrated.

As shown in diagram 500, each sample period may include a clear phase 550, an integrate phase 554, and a hold phase 556. In some examples, there may be a time period 552 between clear phase 550 and integrate phase 554. In some examples, time period 552 may be a part of clear phase 550. As described above, in the clear phase, the clear signal may go high to turn on the clear switches (e.g., switches 440 and 442), and the hold signal may be at a high level such that the input transistors may be deactivated and thus may not charge or discharge the integration capacitors. Therefore, in clear phase 550, the integration capacitors are not charged or discharged based on the input signal, and the two terminals of each integration capacitor may be shorted by the clear switch to remove the charges stored at the two terminals in the prior integrate phase. As such, the voltage levels at first terminals of the integration capacitors (and the collectors of the two input transistors) may be close to the supply voltage (e.g., about 3 V in the illustrated example) as shown by waveforms 530 and 532, and the voltage across the two terminals of each integration capacitor may become zero. Therefore, the differential signal between the first terminals of the two integration capacitors may be zero as shown by waveform 534. In some examples, during time period 552, the clear signal may go low to turn off the clear switches, and the hold signal may remain high so that the input transistors remain deactivated. Thus, during time period 552, the integration capacitors may continue to be reset or cleared, and may reach a stable settled state where the voltage across each integration capacitor may be zero.

In integrate phase 554, the clear signal may be at a low state and the hold signal may go low as well. Therefore, the clear transistors may remain turned off, and the input transistors may be activated, such that the integration capacitors may be charged or discharged by currents that may be close to linear functions of the differential input signal. As shown by waveforms 530 and 532, during the integration phase, as the integration capacitors are charged or discharged, the voltage levels at the terminals of the integration capacitors that are coupled to the collectors or drains of the input transistors may gradually decrease at different rates, and the voltage across the two terminals of each integration capacitor may gradually increase. As a result, the differential signal between the first terminals of the two integration capacitors may linearly track the input signal during the integrate phase as shown by waveforms 534 and 540.

In hold phase 556, the clear signal may remain at a low state and the hold signal may be at a high state. Therefore, the clear transistors may remain turned off, and the input transistors may be deactivated, such that the integration capacitors may neither be charged/discharged nor be cleared and thus the voltage across the two terminals of each integration capacitor and the differential voltage between the first terminals of the two integration capacitors may remain unchanged during the hold phase as shown by waveforms 530, 532, and 534.

The operations in clear phase 550, time period 552, integrate phase 554, and hold phase 556 may be performed in each sample period or integrate-and-hold cycle. It is noted that, in some examples, the hold phase may be longer or shorter than hold phase 556 shown in FIG. 5. For example, when M integrate-and-hold circuits are time-interleaved as described above with respect to FIGS. 1-3, the hold phase may have a duration that may be multiple times of the duration of the integrate phase as shown in FIG. 3, and the length of the integrate phase may be the effective sample period, such that the effective sampling rate may be M times of the sampling rate of each integrate-and-hold circuit.

Figure 6:
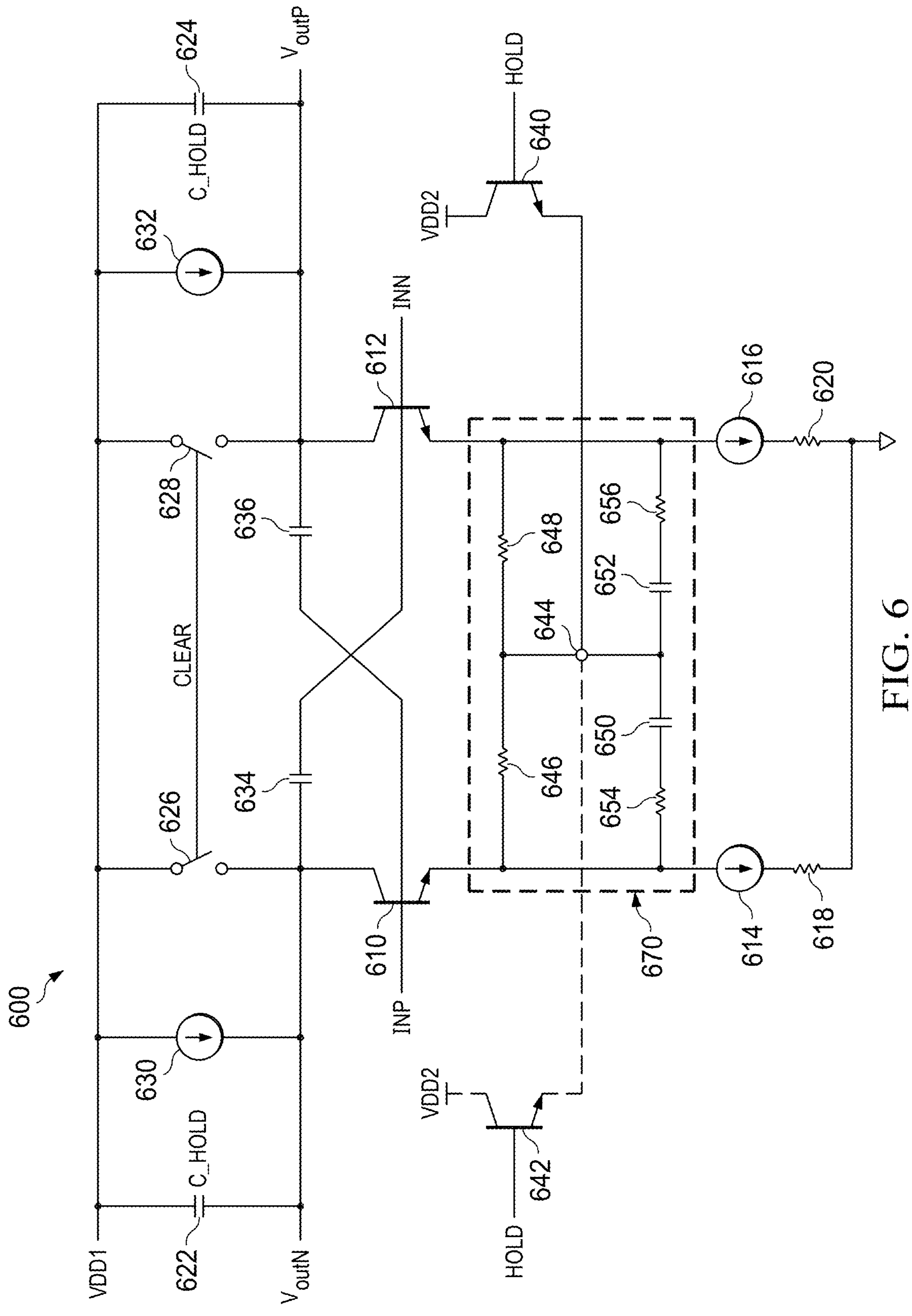
FIG. 6 is a schematic of another example of an integrate-and-hold circuit.

FIG. 6 is a schematic of an example of an integrate-and-hold circuit 600. Integrate-and-hold circuit 600 may be an example of integrate-and-hold core 120, integrate-and-hold core 220, or integrate-and-hold circuit 400 described above. In the illustrated example, integrate-and-hold circuit 600 may include a pair of transistors 610 and 612. Even though transistors 610 and 612 are shown as BJTs (e.g., NPN BJTs) in the illustrated example, transistors 610 and 612 may be other types of transistor such as FETs (e.g., MOSFETs) or PNP BJTs in other examples. The bases (or gates) of the two transistors 610 and 612 may be coupled to a differential input pair, such as the differential output of a CTLE (e.g., CTLE 110 or 210). For example, one end (e.g., the positive end INP) of the differential input pair may be coupled to the base (or gate) of transistor 610, whereas the other end (e.g., the negative end INN) of the differential input pair may be coupled to the base (or gate) of transistor 612. The collector (or drain) of transistor 610 may be electrically coupled to a first terminal of an integration capacitor 622, a current source 630, and a switch 626. A second terminal of integration capacitor 622 may be coupled to a voltage source (e.g., a first voltage supply terminal (labelled VDD1)/a first power terminal)). The collector (or drain) of transistor 612 may be electrically coupled to a first terminal of an integration capacitor 624, a current source 632, and a switch 628. A second terminal of integration capacitor 624 may be coupled to a voltage source (e.g., via a reference terminal, which can be coupled to a voltage supply VDD1, ground, etc.). Current source 630 may be coupled to transistor 610 and the voltage source (e.g., via a reference terminal, the voltage supply VDD1, ground, etc.), and current source 632 may be coupled to transistor 612 and the voltage source (e.g., voltage supply terminal VDD1). Switches 626 and 628 may be coupled to the two terminals of integration capacitors 622 and 624, respectively, and may be controlled by a same clear signal.

The base of transistor 610 may also be coupled to the collector of transistor 612 through a capacitor 636, and the collector of transistor 610 may also be coupled to the base of transistor 612 through a capacitor 634. Capacitors 634 and 636 may be neutralization capacitors and may be implemented using, for example, transistors. As described above, the cross-coupled neutralization capacitors 634 and 636 may cancel the parasitic capacitance between the base and the collector (or between the gate and the drain) of an input transistor on the opposite side to improve equal input charge rejection, SFDR, reverse isolation, power gain, and stability. The collector of transistor 610 and the collector of transistor 612 may also be electrically coupled to the differential output of integrate-and-hold circuit 600. The emitter (or source) of transistor 610 may be electrically coupled to a current source 614, which may be coupled to a resistor 618. The emitter (or source) of transistor 612 may be electrically coupled to a current source 616, which may be coupled to a resistor 620. In some examples, the emitter of transistor 610 may be electrically coupled to resistor 618, which may be coupled to current source 614, while the emitter of transistor 612 may be electrically coupled to resistor 620, which may be coupled to current source 616.

As illustrated, integrate-and-hold circuit 600 may include resistors (e.g., resistors 646, 648, 654, and 656) and capacitors (e.g., capacitors 650 and 652) that may form a three-port bias/degeneration network 670 that includes a DC path and an AC path between a bias terminal 644 and emitters of transistors 610 and 612. Bias terminal 644 may be coupled to a bias voltage (e.g., via a reference terminal, which can be coupled to a ground voltage, a second voltage supply or a second power terminal, labelled VDD2) though one or more switches (e.g., a transistor 640 and/or a transistor 642). The switches may be controlled by a HOLD signal that may be applied to the base of transistor 640 and/or the base of transistor 642. Even though FIG. 6 shows transistors 640 and 642 as NPN BJTs, transistors 640 and 642 may be another type of transistor, such as MOSFETs, PNN BJTs, etc. Resistor 646 may be coupled between bias terminal 644 and the emitter of transistor 610, and resistor 648 may be coupled between bias terminal 644 and the emitter of transistor 612. Thus, resistors 646 and 648 may form the DC path between bias terminal 644 and the emitters of transistors 610 and 612 for applying a DC bias to the emitters of transistors 610 and 612 to deactivate/reactivate transistors 610 and 612, when transistors 640/642 are enabled (e.g., by an active high or active low HOLD signal). Resistor 654 and capacitor 650 may be coupled between bias terminal 644 and the emitter of transistor 610, and resistor 656 and capacitor 652 may be coupled between bias terminal 644 and the emitter of transistor 612. Thus, resistors 654 and 656 and capacitors 650 and 652 may form the AC path between bias terminal 644 and the emitters of transistors 610 and 612. The bias network, when disconnected from the bias voltage, may also provide a degeneration network used for both differential-pair emitter/source degeneration. d, and thus may improve the linearity of integrate-and-hold circuit 600. Also, the electrical path from transistor 642 via resistor 646 to the emitter/source of transistor 610 can be matched with the electrical path from transistor 640 via resistor 648 to the emitter/source of transistor 612, and the matched electrical path allows charge injected by the transistors 640/642 during the transition of the HOLD signal into integration capacitors 622 and 624 to be common mode noise charge and can be cancelled out in the voltage difference between $V_{outN}$ and $V_{outP}$. The AC path can also set the frequency response of the differential pair of transistors 610 and 612 by, for example, boosting the gain of the differential pair at a high frequency. The AC path can also increase the speed of bringing the emitters/sources of transistors 610/612 to the bias voltage to deactivate transistors 610/612, which can further reduce the disturbance of the charge held in capacitors 622 and 624 during the transition of the HOLD signal. All these can improve the performance of integrate-and-hold circuit 600. In some examples, the total capacitance of integration capacitor 622 or 624 and any linear parasitic capacitance connected to integration capacitor 622 or 624 may be between about one time and ten times of the total non-linear parasitic capacitance connected to integration capacitor 622 or 624.

When activated (e.g., when transistors 640 and 642 are switched off), transistors 610 and 612 may operate under the linear operating condition, such that the differential input signal at the differential input pair may cause a collector (or drain) current of transistor 610 that may be a linear function of the current or voltage level at the positive end INP of the differential input pair, and may also cause a collector (or drain) current of transistor 612 that may be a linear function of the current or voltage level at the negative end INN of the differential input pair. The collector (or drain) current of transistor 610 may be at least partially provided from a voltage supply (e.g., voltage supply VDD1) through integration capacitor 622, and thus may charge or discharge integration capacitor 622. Similarly, the collector current of transistor 612 may be at least partially provided from the voltage supply through integration capacitor 622, and thus may charge or discharge integration capacitor 622. A portion of the collector current of transistor 610 may be supplied by current source 630 such that transistor 610 may be at a state close to the linear operating condition when it is deactivated, and thus may be more quickly set to the linear operating condition when it is activated to integrate the input signal. Similarly, a portion of the collector current of transistor 612 may be supplied by current source 632 such that transistor 612 may be at a state close to the linear operating condition when it is deactivated, and thus may be more quickly set to the linear operating condition when it is activated to integrate the input signal. Current source 630 and current source 632 may be part of a current mirror and may have a same small current. Switches 626 and 628 may be switched off during the integrate phase and hold phase, but may be switched on during the clear phase to short the two terminals of integration capacitor 622 and the two terminals of integration capacitor 624, thereby clearing the integrated signals and resetting integration capacitors 622 and 624.

On the emitter (or source) side of transistor 610, resistor 618 at the emitter of transistor 610 may be used to, for example, reduce noise, reduce temperature and input dependence of the gain, and improve the linearity of integrate-and-hold circuit 600, but may reduce the gain of integrate-and-hold circuit 600, as described above with respect to FIG. 4. In some examples, the resistance of resistor 618 may be between about two times and about five times of the impedance seen at the emitter (e.g., the intrinsic emitter resistance) of transistor 610 to balance the noise/nonlinearity reduction and gain reduction of integrate-and-hold circuit 600. Similarly, resistor 620 at the emitter of transistor 612 may be used to, for example, reduce noise, reduce temperature and input dependence of the gain, and improve the linearity of integrate-and-hold circuit 600, but may reduce the gain of integrate-and-hold circuit 600. In some examples, the resistance of resistor 620 may be between about two times and about five times of the impedance seen at the emitter (e.g., the intrinsic emitter resistance) of transistor 612 to balance the noise/nonlinearity reduction and gain reduction of integrate-and-hold circuit 600. Current source 630 and current source 632 may be parts of a current mirror and may provide the bias current for transistors 610 and 612, respectively.

To linearly deactivate the integration and hold the integrated signal, transistors 640 and/or 642 may be turned on by the HOLD signal, such that the voltage level at bias terminal 644 may be quickly set to a level (via degeneration network 670) close to the base/gate voltage of transistors 640/642 to deactivate the transistors, which can reduce the activation/deactivation transition time. Also, having transistors 640 and 642 coupled between the voltage supply VDD2 (and/or a reference terminal) and bias terminal 644 can also improve the overall symmetricity between the signal paths from the HOLD signal to the emitter/source of transistors 610 and 612, as explained above.

Figure 7:
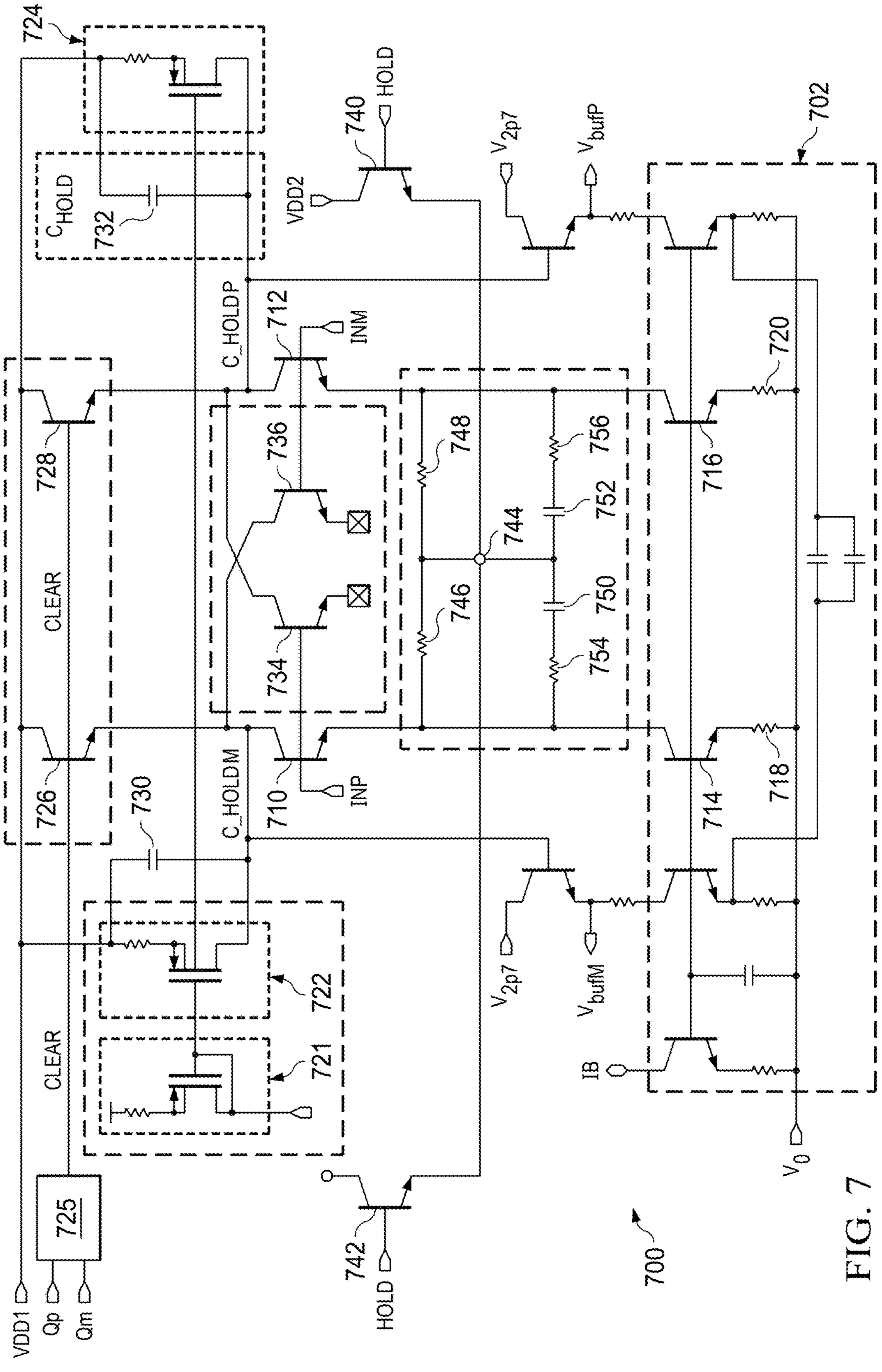
FIG. 7 is a schematic of another example of an integrate-and-hold circuit.

FIG. 7 is a schematic of an example of an integrate-and-hold circuit 700. Integrate-and-hold circuit 700 may be an example of integrate-and-hold circuit 600 described above. Operations of integrate-and-hold circuit 700 may be similar to the operations of integrate-and-hold circuits 400 and 600 described above with respect to, for example, FIGS. 4-6. In the illustrated example, integrate-and-hold circuit 700 may include a pair of transistors 710 and 712, which may be BJTs or MOSFETs. The bases (or gates) of transistors 710 and 712 may be coupled to a differential input pair, such as the differential output pair of a CTLE (e.g., CTLE 110 or 210). For example, one end (e.g., the positive end INP) of the differential input pair may be coupled to the base of transistor 710, whereas the other end (e.g., the negative end INN) of the differential input pair may be coupled to the base of transistor 712. The collector (or drain) of transistor 710 may be electrically coupled to a first terminal (e.g., at a node C_HOLDm) of an integration capacitor 730, a current source 722, and a switch 726. A second terminal of integration capacitor 730 may be coupled to a voltage source (e.g., a voltage supply VDD1). The collector (or drain) of transistor 712 may be electrically coupled to a first terminal (e.g., at a node C_HOLDp) of an integration capacitor 732, a current source 724, and a switch 728. A second terminal of integration capacitor 732 may be coupled to a voltage source (e.g., voltage supply VDD1). As described above, when transistors 710 and 712 are activated to generate collector currents that may be linear functions of the differential input signal, integration capacitors 730 and 732 may be charged or discharged by the collector currents, thereby integrating the differential input signal during the integrate phase. The collector of transistor 710 and the collector of transistor 712 may also be electrically coupled to the differential output of integrate-and-hold circuit 700, such that the voltage level at the first terminal (e.g., at node C_HOLDm) of integration capacitor 730 and the voltage level at the first terminal (e.g., at node C_HOLDp) of integration capacitor 732 may be output to subsequent circuits (e.g., a buffer) of the integrate-and-hold circuit.

Current source 722 may be coupled to transistor 710 and a voltage source (e.g., voltage supply VDD1), while current source 724 may be coupled to transistor 712 and the voltage source (e.g., voltage supply VDD1). As illustrated, current source 722 and current source 724 may be parts of a current mirror that also include a current source 721, where the currents of current sources 722 and 724 may be set by the current of current source 721. As described above, current sources 722 and 724 may be used to provide a low collector current so that transistors 710 and 712 may be weakly turned on (e.g., not fully turned off) before the integrate phase (e.g., during the hold and clear phases) and may be more quickly set to the linear operating condition when transistors 710 and 712 are activated to integrate the input signal, thereby improving the swing of the integration current, reducing noise, and improving SFDR. In the illustrated example, the current mirror may include PMOS transistors. In other examples, other types of transistor such as BJTs may be used in the current mirror.

Switches 726 and 728 may be coupled to the two terminals of integration capacitors 730 and 732, respectively, and may be controlled by a same clear signal that may be generated by a control circuit 725 to short the two terminals of each integration capacitor 730 or 732, thereby clearing/resetting the integration capacitors. Switches 726 and 728 may be implemented using transistors that can switch fast, such as BJTs, for fast and linear reset of integration capacitors 730 and 732. In some examples, switches 726 and 728 may be implemented using other types of transistor, such as MOSFETs.

The base of transistor 710 may also be coupled to the collector of transistor 712 through a neutralization capacitor implemented using a transistor 734. For example, the base of transistor 710 may be coupled to the base of transistor 734, the collector of transistor 734 may be coupled to the collector of transistor 712, and the emitter of transistor 734 may be floating. The collector of transistor 710 may also be coupled to the base of transistor 712 through a neutralization capacitor implemented using a transistor 736. For example, the base of transistor 712 may be coupled to the base of transistor 736, the collector of transistor 736 may be coupled to the collector of transistor 712, and the emitter of transistor 736 may be floating. As described above, the cross-coupled neutralization capacitors may cancel the parasitic capacitance between the base and the collector (or between the gate and the drain) of an input transistor on the opposite side to improve equal input charge rejection, SFDR, reverse isolation, power gain, and stability.

The emitter of transistor 710 may be electrically coupled to a current source 714, which may be coupled to a resistor 718. The emitter of transistor 712 may be electrically coupled to a current source 716, which may be coupled to a resistor 720. In some examples, the emitter of transistor 710 may be electrically coupled to resistor 718, which may be coupled to current source 714, while the emitter of transistor 712 may be electrically coupled to resistor 720, which may be coupled to current source 716. As described above with respect to FIGS. 4 and 6, resistors 718 and 720 may be used to, for example, reduce noise, reduce temperature and input dependence of the gain, and improve the linearity of integrate-and-hold circuit 700, but may reduce the gain of integrate-and-hold circuit 700. In some examples, the resistance of resistor 718 or 720 may be between about two times and about five times of the impedance seen at the emitter (e.g., the intrinsic emitter resistance) of transistor 710 or 712 to balance the noise/nonlinearity reduction and gain reduction of integrate-and-hold circuit 700. Current sources 714 and 716 may be used to bias integrate-and-hold circuit 700, and may be part of a current mirror 702.

Integrate-and-hold circuit 700 may also include resistors (e.g., resistors 746, 748, 754, and 756) and capacitors (e.g., capacitors 750 and 752) that may form a bias network that includes a DC path and an AC path between a bias terminal 744 and emitters of transistors 710 and 712. Bias terminal 744 may be coupled to a bias voltage (e.g., a voltage supply VDD2) though one or more switches (e.g., a transistor 740 and/or a transistor 742). The switches may be controlled by a HOLD signal that may be applied to the bases of transistor 740 and/or transistor 742. Even though FIG. 7 shows transistors 740 and 742 as NPN BJTs, transistors 740 and 742 may be another type of transistor, such as MOSFETs. Resistor 746 may be coupled between bias terminal 744 and the emitter of transistor 710, and resistor 748 may be coupled between bias terminal 744 and the emitter of transistor 712. Thus, resistors 746 and 748 may form the DC path between bias terminal 744 and the emitters of transistors 710 and 712 for applying a DC bias to the emitters of transistors 710 and 712 to deactivate transistors 710 and 712. Resistor 754 and capacitor 750 may be coupled between bias terminal 744 and the emitter of transistor 710, and resistor 756 and capacitor 752 may be coupled between bias terminal 744 and the emitter of transistor 712. Thus, resistors 754 and 756 and capacitors 750 and 752 may form the AC path between bias terminal 744 and the emitters of transistors 710 and 712 for applying an AC bias to the emitters of transistors 710 and 712 to more quickly deactivate transistors 710 and 712. The bias network may be used for both differential-pair emitter/source degeneration and linear deactivation/reactivation of the differential pair that includes transistors 710 and 712, and thus may further improve the linearity of integrate-and-hold circuit 700. In some examples, the total capacitance of integration capacitor 730 or 732 and any linear parasitic capacitance connected to integration capacitor 730 or 732 may be between about one time and ten times of the total non-linear parasitic capacitance connected to integration capacitor 730 or 732.

Control circuit 725 may be used to generate a clear signal that may include a pulse with a duration about a half of a clock cycle in each sampling period as shown in FIG. 5, where the other half of the clock cycle after the pulse, such as time period 552, may be the settling time that is after the clear phase but before the integrate phase. Control circuit 725 may receive a differential input pair, where each single-end input Qp or Qm of the differential input pair may include a positive or negative pulse that has a duration about a half of a clock cycle. Control circuit 725 may generate a single-end output signal that has a positive pulse with a duration about a half of a clock cycle for use as the clear signal for controlling switches 726 and 728. The differential input pair to control circuit 725 may be generated, for example, by a clock gating circuit using a differential clock signal and a gating signal as described in detail below with respect to FIGS. 8 and 9.

Figure 8:
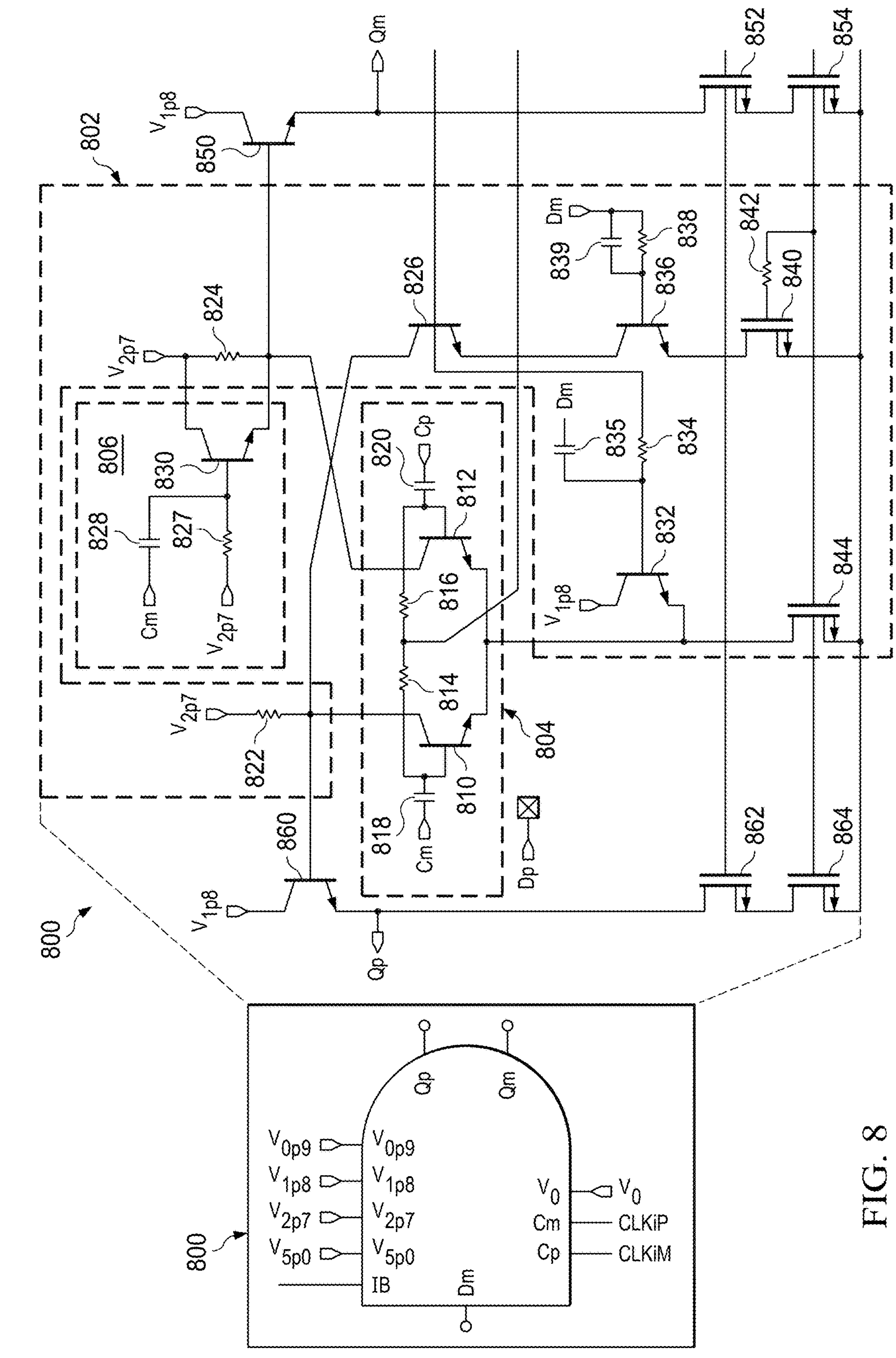
FIG. 8 is a schematic of an example of a clock gating circuit that may be used to generate a differential output signal having a pulse with a width about a half of a clock cycle in each sampling period.

FIG. 8 is a schematic of an example of a clock gating circuit 800 that may be used to generate a differential output signal having a pulse with a width about a half of a clock cycle in each integrate-and-hold phase. The differential output signal may be used as the differentia input (e.g., Qp/Qm) to control circuit 725. Clock gating circuit 800 may use NPN BJTs as high speed devices, and may use a differential clock (CLKiP/CLKiM) and an approximately synchronous gating control signal Dm (e.g., a negative gating input) having a pulse with a width about one clock period in each integrate-and-hold phase. In the illustrated example, clock gating circuit 800 may include a first block 802 that includes two constant-biased current sinks, a differential pair 804, and a BJT clamp circuit 806.

The two constant-biased current sinks in first block 802 may include a first current sink 844 and a second current sink 840. First current sink 844 may sink current from differential pair 804, unless an overriding BJT device 832 diverts the sink current of first current sink 844. BJT device 832 may be controlled by DC biasing the base through a base resistor 834 and AC biasing the base through a capacitor 835 using gating control signal Dm. Second current sink 840 may be controlled using a bias voltage through a resistor 842 to sink current from a BJT current regulating cascoded device that may include a BJT 826 and a BJT 836, and thus may control the base voltage and base current of a transistor 860 that drives the positive output Qp. The base of BJT 826 may be controlled using the signal that applies DC biasing to BJT device 832, and the collector of BJT 826 may be coupled to the base of transistor 860 and a resistor 822 between the base of transistor 860 and a supply voltage. BJT 836 may be controlled by DC biasing the base through a base resistor 838 using gating control signal Dm and AC biasing the base through a capacitor 839 using gating control signal Dm. The positive output Qp may be pulled down by transistors 862 and 864.

Differential pair 804 may include a transistor 810 and a transistor 812. The collector of transistor 810 may be coupled to the base of transistor 860. The collector of transistor 812 may be coupled to the base of a transistor 850 that drives the negative output Qm, and may also be coupled to a supply voltage through a collector resistor 824. The negative output Qm may be pulled down by transistor 852 and 854. As described above, first current sink 844 may be coupled to the emitters of transistors 810 and 812 to provide the bias (sink) current for differential pair 804. The gates of transistors 854 and 864 and the transistor of first current sink 844 may be coupled to a same control voltage level. The sources of transistors 854 and 864 and the transistor of first current sink 844 may also be coupled to a same control voltage level. The gates of transistors 852 and 862 may be coupled to a same control voltage level. The base of transistor 810 and the base of transistor 812 may be DC biased using a bias voltage through resistors 814 and 816, respectively. The base of transistor 810 and the base of transistor 812 may also be AC biased through capacitors 818 and 820 using the differential clock (CLKiP/CLKiM) applied to ports Cm and Cp. Using separate DC biasing path and AC capacitor-coupled input clock path may allow separate optimization of the two paths to achieve the desired high speed, high slew rate switching. Differential pair 804 may be selectively activated when gating control signal Dm has a negative pulse (and thus current sink 844 may sink current from differential pair 804), thereby allowing the differential clock at ports Cp and Cm to appropriately affect the outputs Qp and Qm to generate a half-clock-cycle pulse in outputs Qp and Qm.

BJT clamp circuit 806 may include a NPN BJT transistor 830 and a bias circuit coupled to the base of BJT transistor 830. The bias circuit may include a resistor 827 coupled to a DC bias voltage (e.g., a supply voltage) and a capacitor 828 coupled to port Cm and positive clock input CLKiP. BJT transistor 830 may normally be turned on due to the DC biasing by the supply voltage through resistor 827, and, due to the AC biasing by positive clock input CLKiP through capacitor 828, may quickly increase the base current and voltage of transistor 850 and thus may quickly pull the voltage level at the negative output Qm to high after the end of the half clock period, thereby achieving a short output pulse width.

Figure 9:
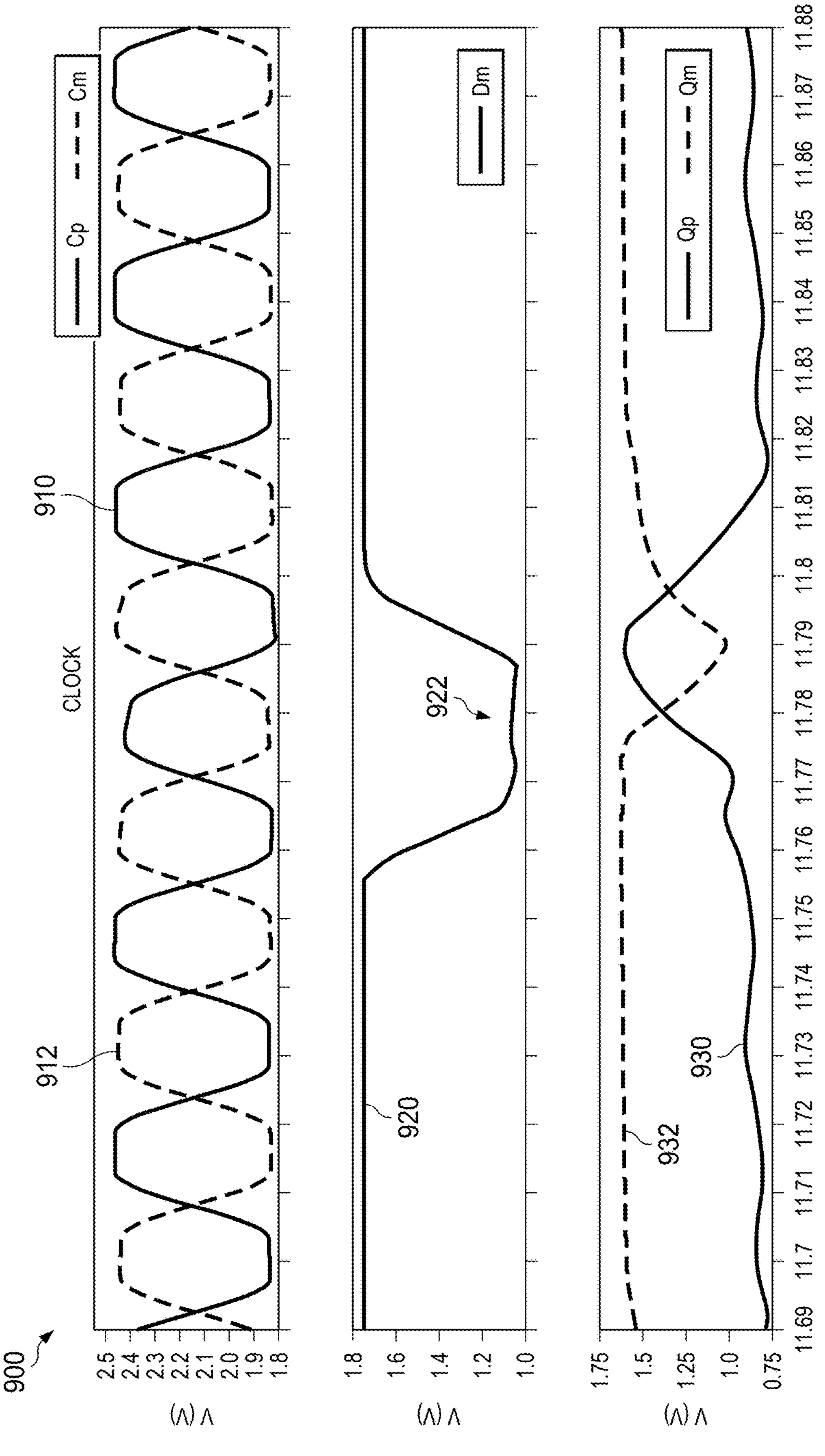
FIG. 9 is a diagram including examples of waveforms of input and output signals of the clock gating circuit of FIG. 8.

FIG. 9 is a diagram 900 including examples of waveforms of input and output signals of clock gating circuit 800. In diagram 900, a waveform 910 shows an input clock signal (e.g., CLKiM) at port Cp, and a waveform 912 shows an input clock signal (e.g., CLKiP) at port Cm. The input clock signal at port Cp and the input clock signal at port Cm may be approximately complementary to each other to form a differential clock. Waveform 920 shows an example of gating control signal Dm, which may be normally high and may include a negative pulse 922 that may have a duration about a clock cycle. A waveform 930 shows an example of the positive output Qp of clock gating circuit 800, whereas a waveform 932 shows an example of the negative output Qm of clock gating circuit 800. As illustrated, the positive output Qp may include a positive pulse having a duration about a half of a clock cycle, and the negative output Qm may include a negative pulse having a duration about a half of a clock cycle. As described above with respect to FIG. 7, positive output Qp and negative output Qm may be used as inputs by control circuit 725 to generate a single-end control signal CLEAR that may have a pulse with a width about a half of a clock cycle to control switches for clearing/resetting integration capacitors.

As described above, in order to achieve high-speed and high-linearity integrate-and-hold, the control signals, such as the hold signal for controlling transistor 418, 640, 642, 740, or 742, may have a high slew rate for fast switching and can remain in stable states when the signals are not switched. According to certain examples, a hold control circuit may use a combination of a high-speed AC path and a DC path to generate a hold control signal that has a large swing and a high-slew rate during switching, and can remain flat when the hold control signal is not switching.

The AC path may include a push-pull driver that includes two transistors (e.g., BJTs), where the two transistors may be DC biased in class AB mode such that they are close to being turned on but are effectively off even though there may be a small nominal quiescent biasing current flowing through the transistors. The two transistors of the push-pull driver may be controlled using a differential control signal through AC coupling capacitors. This allows for fast rising and falling edges in the hold control signal at the output, but may suffer from drooping if the DC path is not used. The DC path may include multiple small switches (e.g., MOS devices) that control the base/gate of the upper push device of the push-pull driver, where the small switches may be selectively activated to pull up or pull down the base/gate of the upper push device to provide a prolonged high or low hold control signal at the output.

Figure 10:
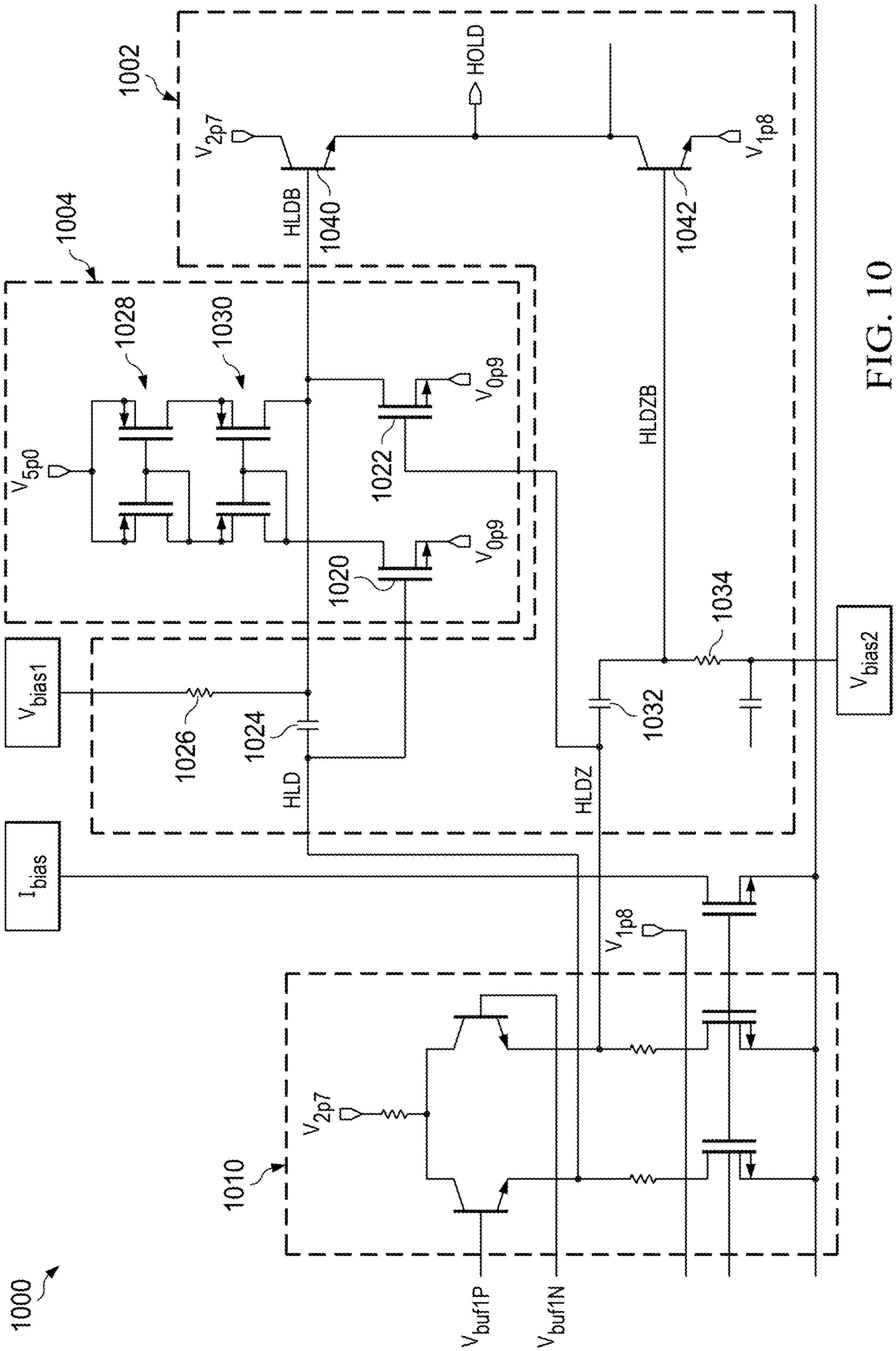
FIG. 10 is a schematic of an example of a control circuit for generating a hold control signal.

FIG. 10 is a schematic of an example of a control circuit 1000 for generating a hold control signal that may be used to control, for example, transistor 418, transistor 640 (and/or transistor 642), or transistor 740 (and/or transistor 742). Control circuit 1000 may generate a hold control signal HOLD that has a large swing and a high-slew rate during switching, and can remain flat when the signal is not switching, by using a combination of a high-speed AC path 1002 and a DC path 1004. Control circuit 1000 may include a first stage 1010 that may include a differential amplifier. The differential amplifier may amplify a differential input signal to generate a differential signal (e.g., HLD/HLDZ) to control AC path 1002 and DC path 1004.

AC path 1002 may include a push-pull driver that includes a transistor 1040 (which may be the push transistor) and a transistor 1042 (which may be the pull transistor). Transistors 1040 and 1042 may have high drive capability and may be implemented using BJTs, such as NPN BJTs as shown in the illustrated example. The base/gate of transistor 1040 may be DC biased by a bias voltage Vbias1 through a resistor 1026, such that transistor 1040 may be close to being turned on but is not turned on yet, and can be turned on quickly when an additional drive signal is applied through, for example, an AC path in which the base/gate of transistor 1040 is driven by a single-end signal HLD of the differential signal from first stage 1010 through a capacitor 1024. Therefore, when the single-end signal HLD has a rising edge, transistor 1040 may be turned on quickly, such that the voltage level at the emitter/source of transistor 1040 may be pulled up quickly and thus the hold control signal HOLD at the emitter/source of transistor 1040 may have a fast rising edge. The base/gate of transistor 1042 may be DC biased by a bias voltage Vbias2 through a resistor 1034, such that transistor 1042 may be close to being turned on but is not turned on yet, and can be turned on quickly when an additional drive signal is applied through, for example, an AC path where the base/gate of transistor 1042 may be driven by a single-end signal HLDZ of the differential signal from first stage 1010 through a capacitor 1032. Therefore, when the single-end signal HLDZ has a rising edge, transistor 1042 may be turned on quickly, such that the voltage level at the collector/drain of transistor 1042 may be pulled down quickly and thus the hold control signal HOLD at the collector/drain of transistor 1042 may have a fast falling edge.

DC path 1004 may be used to control transistor 1040 that is used as the push transistor of the push-pull driver. In the illustrated example, DC path 1004 may include transistors 1020 and 1022, and a cascoded current mirror that includes a first current mirror 1028 and a second current mirror 1030. Transistors 1020 and 1022 and transistors of current mirrors 1028 and 1030 may be smaller transistors with lower drive capability compared with transistors 1040 and 1042. In the illustrated example, these transistors may be MOSFETs. To provide a hold control signal HOLD with a prolonged high at the output, the single-end signal HLD may activate transistor 1020, such that the cascoded current mirror may be turned on to pull up the base/gate of transistor 1040 to its highest level (e.g., close to the supply voltage of the cascoded current mirror). To provide a hold control signal HOLD with a prolonged low at the output, the single-end signal HLD may deactivate transistor 1020 and thus may turn off the cascoded current mirror such that its output is effectively a high impedance tristate, and the single-end signal HLDZ may activate transistor 1022, which may pull down the base/gate of transistor 1040 to the lowest level set by the source/emitter voltage (e.g., a supply voltage) of transistor 1022. A small nominal quiescent biasing current flowing through transistor 1040 due to the DC bias at the base/gate of transistor 1040 may maintain a low output level on hold control signal HOLD. Transistors 1020 and 1022 and transistors of current mirrors 1028 and 1030 may be as small as possible to minimize parasitic capacitance on the base/gate of transistor 1040 so as not to degrade the high-speed performance of the AC path. For example, the coupling capacitor 1024 on the AC path may be an order of magnitude larger than the total parasitic capacitance on the base/gate of transistor 1040.

As described above, some of the signal distortions may be caused by the impedance discontinuities on the signal path, which may cause reflections of the transmitted signal that may be difficult to correct. Buffers such as buffers 230 or 450 may be used to properly terminate the transmission line to reduce impedance discontinuity and signal reflection. The buffers may each have an input impedance that matches the characteristic impedance of the transmission line for routing the signal. In some examples, the buffers may have low output impedance, and thus can drive a load without gain loss caused by termination or can drive a transmission line by adding a termination resistor at the output of the buffer. The buffers may allow multiple transmission lines and buffers to be daisy-chained to extend the transmission channel. In some examples, the buffer may have a push-pull configuration, and may have different input and output common-mode voltages or have same or similar input and output common-mode voltages.

Figure 11:
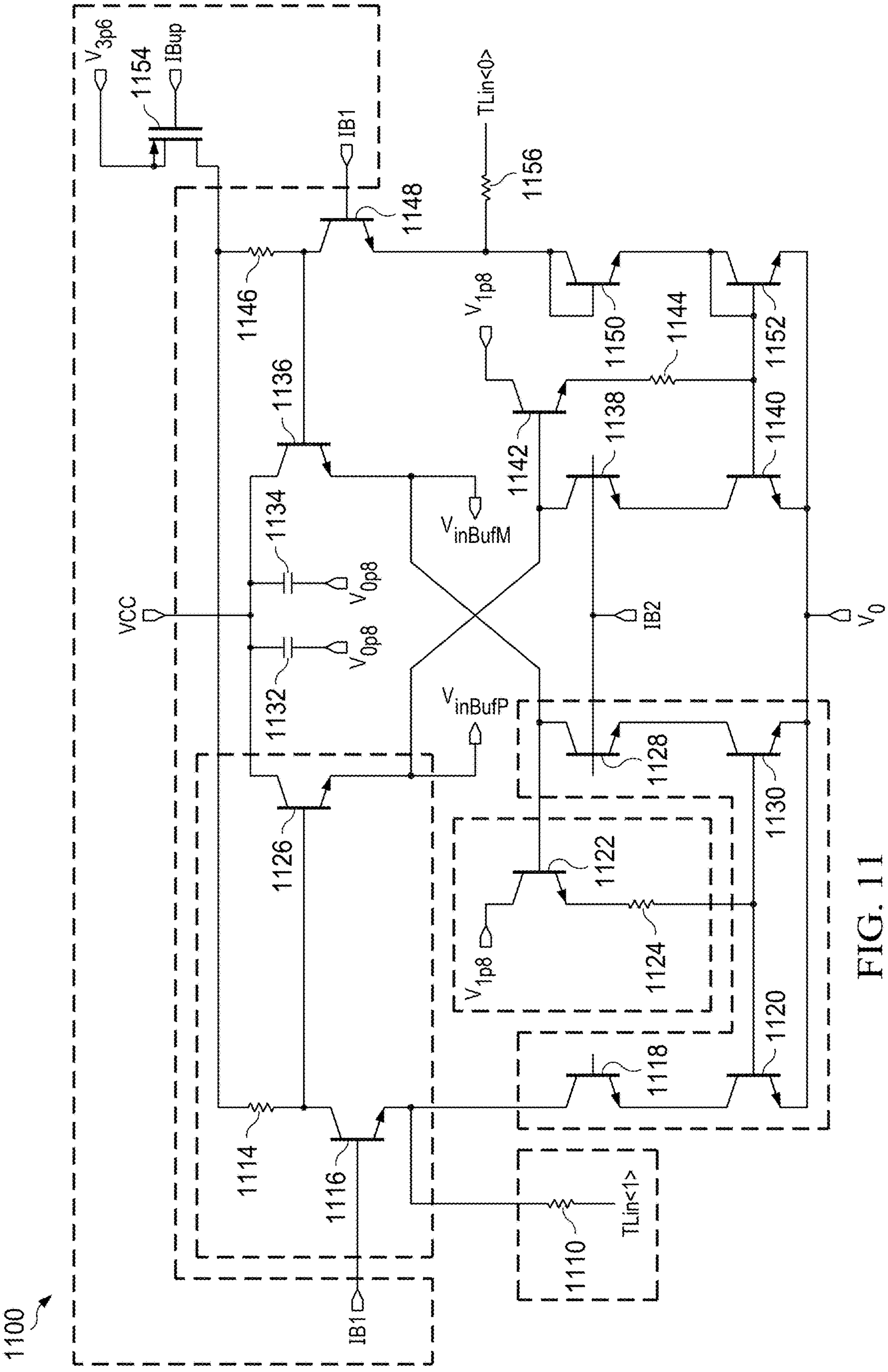
FIG. 11 is a schematic of an example of a transmission line buffer.

FIG. 11 is a schematic of an example of transmission line buffer 1100. In some examples, transmission line buffer 1100 may receive the differential output pair of an integrate-and-hold circuit described above, and distribute it to multiple FFE taps or a multiplexer. For example, transmission line buffer 1100 may be an example of buffer 230 or 450 described above. Transmission line buffer 1100 shown in FIG. 11 may have a symmetrical structure for buffering and driving a differential signal. At each single-end input, an input termination resistor (e.g., input termination resistor 1110 or 1156) may be used to provide an effective input impedance close to (e.g., slightly smaller than) the characteristic impedance of the input transmission line. The input termination resistor may convert the single-end input voltage signal to a current signal. The current signal may be split approximately equally between an upper, push signal path and a lower, pull signal path due to the similar small impedance (e.g., $1/g_m$, where $g_m$ is the transconductance of the transistor) seen into the emitter of a transistor 1116 and seen into the collector of a transistor 1118. The combination of input termination resistor 1110 and the impedance seen into transistor 1116 and 1118 may match the characteristic impedance of the input transmission line.

The upper, push signal path may include transistor 1116, a load resistor 1114, and a transistor 1126. Transistor 1116 may be a common-base BJT device or a common gate MOSFET device. Transistor 1126 may be an output transistor that may include a common collector BJT device or a common drain MOSFET device. In one example, transistor 1126 may be used as an emitter follower, and the collector of transistor 1126 may be coupled to a supply voltage. FIG. 11 also shows two decoupling capacitors 1132 and 1134 coupled to the supply voltage and close to transistors 1126 and 1136 (which may drive the buffer output at high speed) to improve the power integrity at high speed. The gain of the upper, push signal path may depend on the ratio between (1) the impedance of load resistor 1114 and any parasitic impedance at the collector/drain of transistor 1116 and (2) the impedance of input termination resistor 1110 and any parasitic impedance at the emitter/source of transistor 1116, where the ratio may be well-controlled to achieve a well-controlled push gain. In some examples, a linearization resistor (not shown in FIG. 11) may be used at the emitter of transistor 1126 to improve the linearity (e.g., for signals in some lower frequency bands).

The lower, pull signal path may include a current mirror that drives a cascoded common-emitter BJT (or common-source MOS) amplifier that may have a negative gain. Thus, the lower, pull signal path on one side may be used to drive (e.g., pull) the output on the opposite side. In the illustrated example, the lower, pull signal path on the left side may include transistor 1118, 1120, 1128, and 1130 that may form a current mirror such that the portion of the input current passing through transistors 1118 and 1120 may be mirrored to transistors 1128 and 1130. The lower, pull signal path on left side may be used to drive the output at the emitter of a transistor 1136 on the right side. Transistors 1118 and 1120 may be cascoded, and transistors 1128 and 1130 may also be cascoded, such that the parasitic capacitance between the base and drain of transistor 1130 may not significantly affect the speed and bandwidth of the amplifier. Cascoded transistors 1128 and 1130, a transistor 1122, and a feedback resistor 1124 may form the common-emitter amplifier. The gain of the common-emitter amplifier may depend on the ratio between feedback resistor 1124 (and any parasitic impedance between the base of transistor 1130 and collector of transistor 1128) and input termination resistor 1110 (and any parasitic impedance between input termination resistor 1110 and the base of transistor 1130), which may be well-controlled to achieve a well-controlled pull gain. Using transistor 1128 in the cascoded structure to improve speed may add to the voltage drop and may cause the common-mode voltage at the output of the amplifier to be different from the common-mode voltage at the input of the amplifier. In the example illustrated in FIG. 11, transistor 1122 may be coupled between feedback resistor 1124 and the output of the amplifier and may be configured as an emitter-follower (e.g., common-collector BJT device) to provide the voltage drop to compensate for the voltage drop introduced by transistor 1128 and the difference between the input common-mode voltage and output common-mode voltage of the common-emitter amplifier.

Transmission line buffer 1100 may use an external biasing circuit that generates the bias voltage for biasing the base of transistor 1116 to control the transimpedance of transistor 1116 such that the total input impedance at the input may match the impedance of the transmission line. In addition, the bias voltage for biasing the base of transistor 1116 may set the voltage at the base of transistor 1126, which is configured as a emitter follower, such that the output common-mode voltage at the emitter of transistor 1126 may match the input common-mode voltage of transmission line buffer 1100. In some examples, an optional low-power idle current switch 1154 may be used to help to control and approximately match the input common-mode voltage of transmission line buffer 1100 with the output common-mode voltage of transmission line buffer 1100. Due to the impedance matching and common-mode voltage matching, multiple sets of a transmission line and an impedance-matching transmission line buffer 1100 can be daisy-chained to extend the physical channel.

As described, transmission line buffer 1100 may have a symmetrical structure for buffering and driving a differential signal. For example, an input termination resistor 1156 may correspond to input termination resistor 1110. A transistor 1148 may correspond to transistor 1116. A load resistor 1146 may correspond to load resistor 1114. Transistors 1138, 1140, 1142, 1150, and 1152 may correspond to transistors 1128, 1130, 1122, 1118, and 1120, respectively. A resistor 1144 may correspond to resistor 1124. Therefore, these components on the right side and their operations are not described in detail again.

As described above, transmission line buffer 1100 described above may be used to distribute the output of an integrate-and-hold core to two to more FFE taps 240, which may each include two or more taps and may weigh the input on each tap based on the coefficients of the FIR filter and generate a weighted sum of the inputs on the two or more taps as the filtered output. In some example, each tap of the two or more taps may be implemented using a circuit that may be a modified version of the integrate-and-hold circuits described above.

Figure 12:
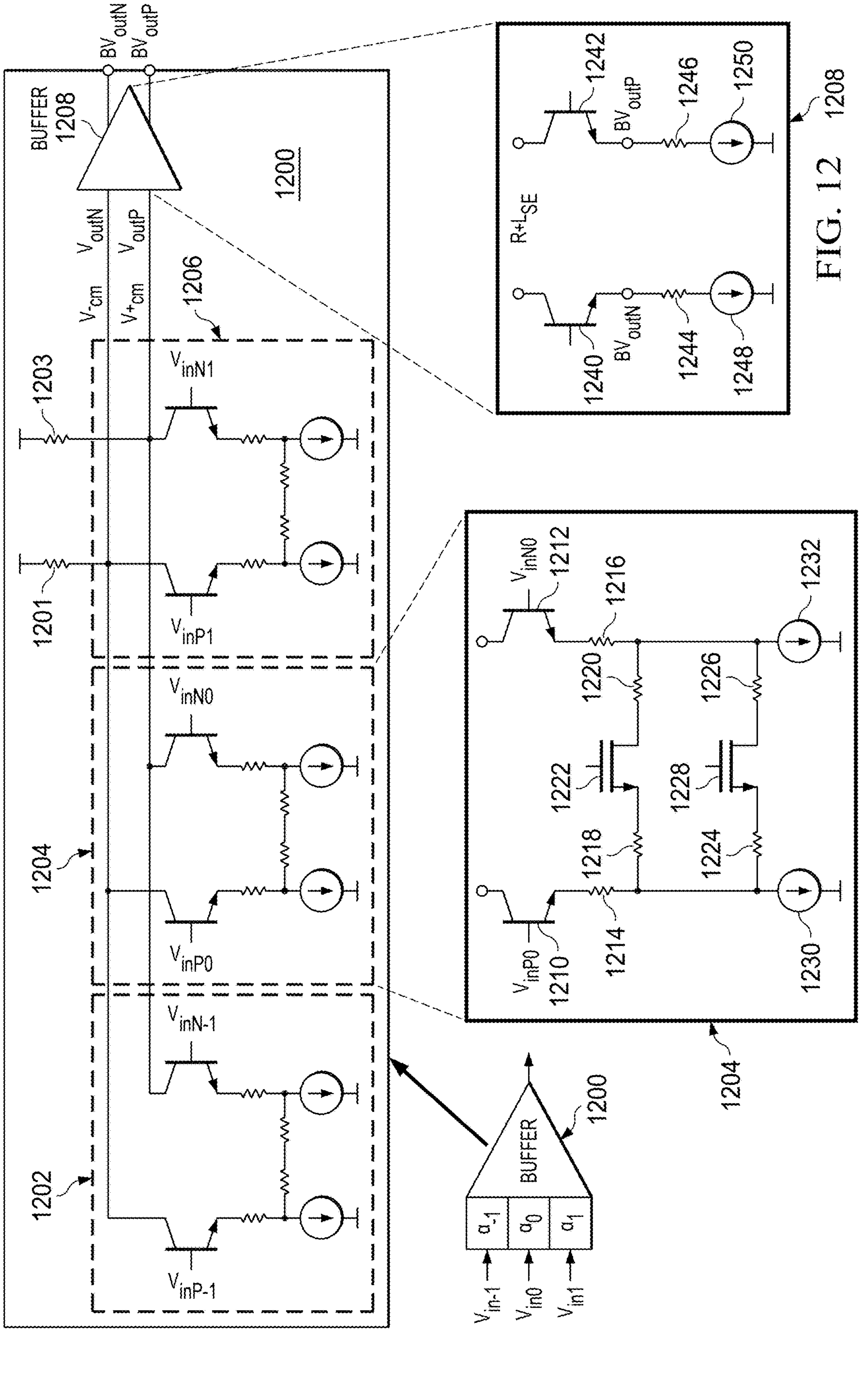
FIG. 12 is a schematic of an example of a feedforward equalizer (FFE) tap.

FIG. 12 is a schematic of an example of an FFE tap 1200. FFE tap 1200 may be an example of FFE taps 240 described above. In the illustrated example, FFE tap 1200 may include a first tap 1202, a second tap 1204, a third tap 1206, and an output buffer 1208. First tap 1202 may receive a differential input pair $V_{in-1}$ and may have a gain $\alpha_{-1}$, second tap 1204 may receive a differential input pair Vino and may have a gain $\alpha_0$, while third tap 1206 may receive a differential input pair $V_{in1}$ and may have a gain $\alpha_1$. In some examples, FFE tap 1200 may have fewer or more taps, such as two taps, four taps, or more than 4 taps. First tap 1202, second tap 1204, third tap 1206, and any other taps may have a similar structure, and may share a pair of load resistors 1201 and 1203. The output of each tap may be coupled to a same differential transmission line that is coupled to output buffer 1208.

As illustrated in FIG. 12, each tap may include a differential amplifier with a target gain. The differential amplifier may include a pair of transistors 1210 and 1212, which may be BJTs or MOSFETs, such as NPN BJTs in the illustrated example. The differential amplifier may include optional resistors 1214 and 1216 coupled to the sources/emitters of transistors 1210 and 1212, respectively, to improve the linearity and set the desired gain (e.g., coefficient $\alpha$). Resistor 1214 may be coupled to a current source 1230, whereas resistor 1216 may be coupled to a current source 1232. Current sources 1230 and 1232 may be parts of a current mirror, may each sink a current $I_m$. In addition, the differential amplifier may include one or more pairs of resistors coupled between resistors 1214 and 1216. The gain of the differential amplifier may depend on the ratio between load resistor 1201 (or 1203) and the impedance at the source/emitter of transistor 1210 (or 1212), including the impedance seen into the source/emitter of transistor 1210 (e.g., $1/g_m$ or $I_m/V_{th}$, where $g_m$ is the transconductance and $V_{th}$ is the threshold voltage of transistor 1210), resistor 1214 (or 1216), and one or more pairs of resistors coupled between resistors 1214 and 1216. The two resistors in a pair of resistors may have same resistance and thus the center tap between the two resistors may be an AC ground. In some examples, the pair of resistors may be coupled together through a switch (e.g., implemented using an MOS transistor), and thus may be switched on or off to adjust the overall impedance at the source/emitter of transistor 1210, thereby achieving the target gain. In the illustrated example, a first pair of resistors may include resistors 1218 and 1220 coupled together through a switch 1222, while a second pair of resistors may include resistors 1224 and 1226 coupled together through a switch 1228. A negative gain may be achieved by swapping the input to the differential amplifier. In some examples, serial capacitors may be used with one or more pairs of resistors between resistors 1214 and 1216 to boost gain for high speed signals. In some examples, load inductors may be used to boost gain.

In the example show in FIG. 12, output buffer 1208 may be an emitter follower buffer that includes a pair of transistors 1240 and 1242, resistors 1244 and 1246 (and optional inductors), and current sources 1248 and 1250. The bases of transistors 1240 and 1242 may be coupled to the outputs of the two or more taps. The emitters of transistors 1240 and 1242 may be coupled to the output of output buffer 1208, which may be coupled to an input port of a multiplexer, such as multiplexer 250.

Figure 13:
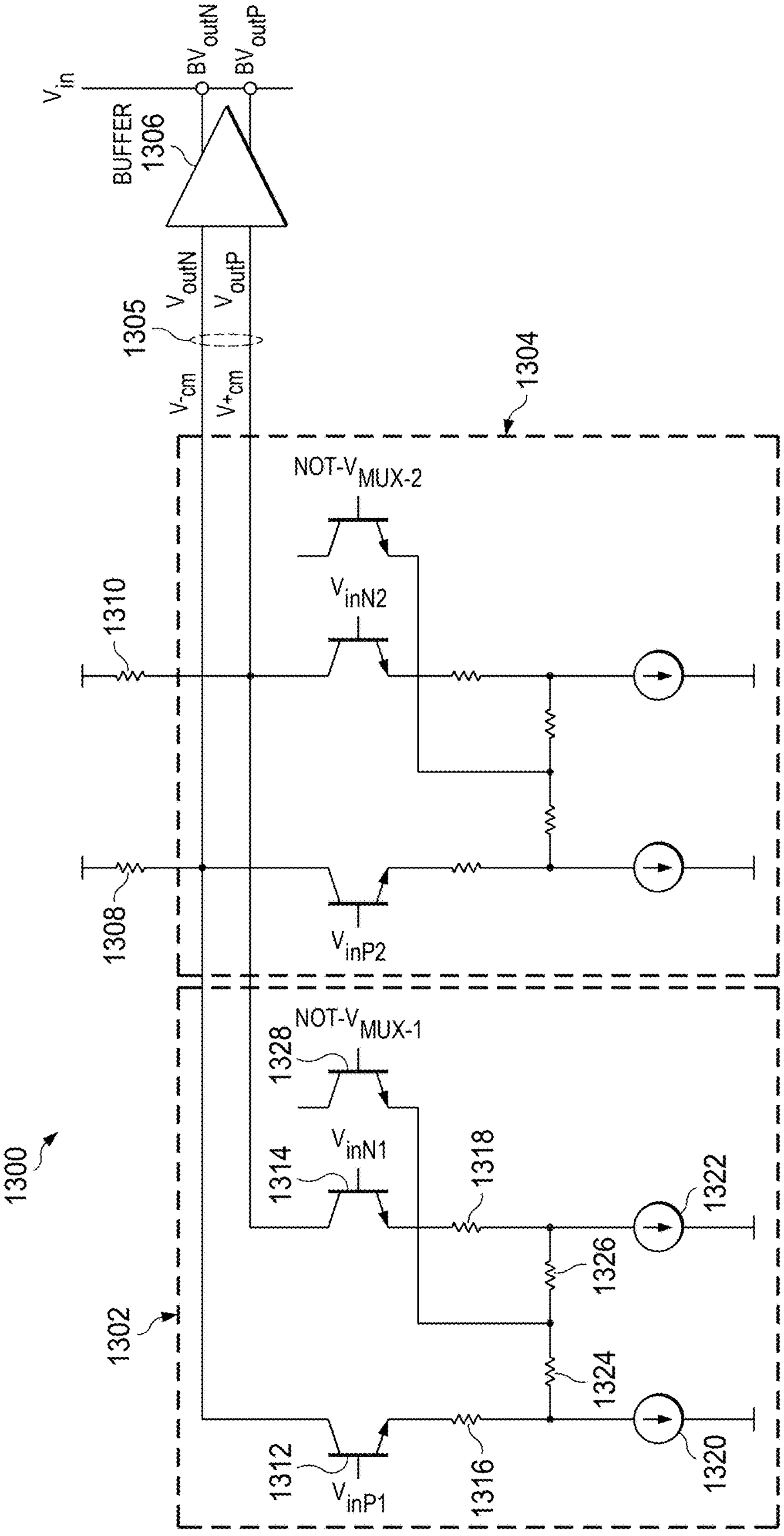
FIG. 13 is a schematic of an example of a multiplexer.

FIG. 13 is a schematic of an example of a multiplexer 1300. Multiplexer 1300 may be an example of multiplexer core 140 or multiplexer 250 described above, and may include two or more input ports. FIG. 13 shows circuits for multiplexing inputs from two input ports of the two or more input ports. In the illustrated example, multiplexer 1300 may include a first block 1302 (e.g., a unity gain amplifier) coupled to a first input port, a second block 1304 (e.g., another unity gain amplifier) coupled to a second input port, an output buffer 1306 coupled to the differential output pairs of first block 1302 and second block 1304, and a pair of load resistors 1308 and 1310 shared by first block 1302 and second block 1304. Each of first block 1302 and second block 1304 may include a circuit that may be a modified version of the integrate-and-hold circuit 400, 600, or 700, first tap 1202, second tap 1204, or third tap 1206 described above. Additional circuit blocks similar to first block 1302 and second block 1304 may be used to multiplex additional inputs.

In the illustrated example, each of first block 1302 and second block 1304 may include a pair of transistors 1312 and 1314, which may be BJTs or MOSFETs, such as NPN BJTs in the illustrated example. The bases/gates of transistors 1312 and 1314 may be coupled to the differential input pair, and the collectors/drains of transistors 1312 and 1314 may be coupled to a shared differential transmission line 1305 that is coupled to output buffer 1306. Optional resistors 1316 and 1318 may be coupled to the sources/emitters of transistors 1312 and 1314, respectively, to improve the linearity. Resistor 1316 may be coupled to a current source 1320, whereas resistor 1318 may be coupled to a current source 1322. Current sources 1320 and 1322 may be parts of a current mirror. In addition, the differential amplifier may include one or more pairs of resistors coupled between resistors 1316 and 1318. Resistors 1324 and 1326 in each pair of resistors may have the same resistance and the center tap (a bias terminal) between the two resistors may be coupled to a bias voltage through a switch 1328, which may be implemented using an NPN BJT in the illustrated example. The gain of each of first block 1302 and second block 1304 may depend on the ratio between load resistor 1308 (or 1310) and the impedance at the source/emitter of transistor 1312 (or 1314), including the impedance seen into the source/emitter of transistor 1312 (e.g., $1/g_m$ or $I_m/V_{th}$, where $g_m$ is the transconductance and $V_{th}$ is the threshold voltage of transistor 1312) or 1314, resistor 1316 (or 1318), and resistor 1324 (or 1326). The resistance values of load resistor 1308, resistor 1316, and resistor 1324 may be selected such that a gain of 1 may be achieved.

To connect the input from one input port to the output of multiplexer 1300, switch 1328 of the corresponding block may be turned off, such that transistors 1312 and 1314 may be activated to generate a differential output signal at the collectors/drains of transistors 1312 and 1314 based on the different input signal at the bases/gates of transistors 1312 and 1314. The differential output signal may be sent to output buffer 1306 through the differential transmission line. When switch 1328 is turned on, the emitters/sources of transistors 1312 and 1314 may be biased to a high level through resistors 1324, 1326, 1316, and 1318, such that transistors 1312 and 1314 may be deactivated as described above with respect to, for example, FIGS. 4, 6, and 7, and thus the input from the input port may be electrically disconnected from the shared differential transmission line 1305 and may not be coupled to the output port of multiplexer 1300.

Even though not shown in FIG. 13, in some examples, each block of first block 1302 and second block 1304 may include an AC biasing path between the center tap of resistors 1324 and 1316 and resistors 1316 or 1318 (and the emitter/source of transistor 1312 or 1314) to improve the linearity and speed of each block of the multiplexer, as described with respect to, for example, FIGS. 6 and 7. For example, a resistor and a capacitor may be serially coupled between the bias terminal and resistor 1316, and a resistor and a capacitor may be serially coupled between the bias terminal and resistor 1318. The resistors and capacitors may apply an AC bias to the emitters/sources of transistors 1312 and 1314 to more quickly and linearly deactivate/reactivate transistors 1312 and 1314.

Figure 14:
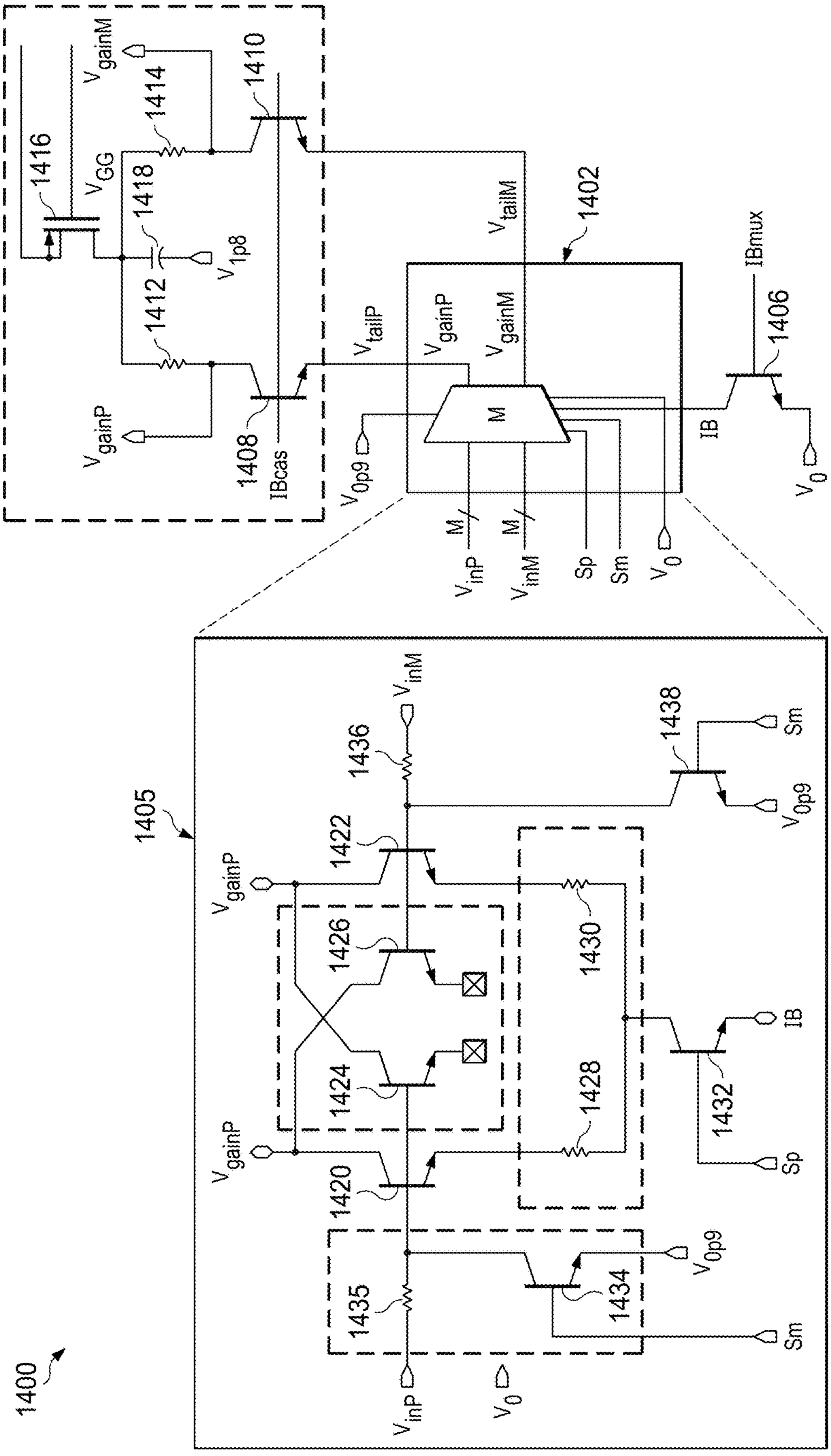
FIG. 14 is a schematic of another example of a multiplexer.
Figure 14:
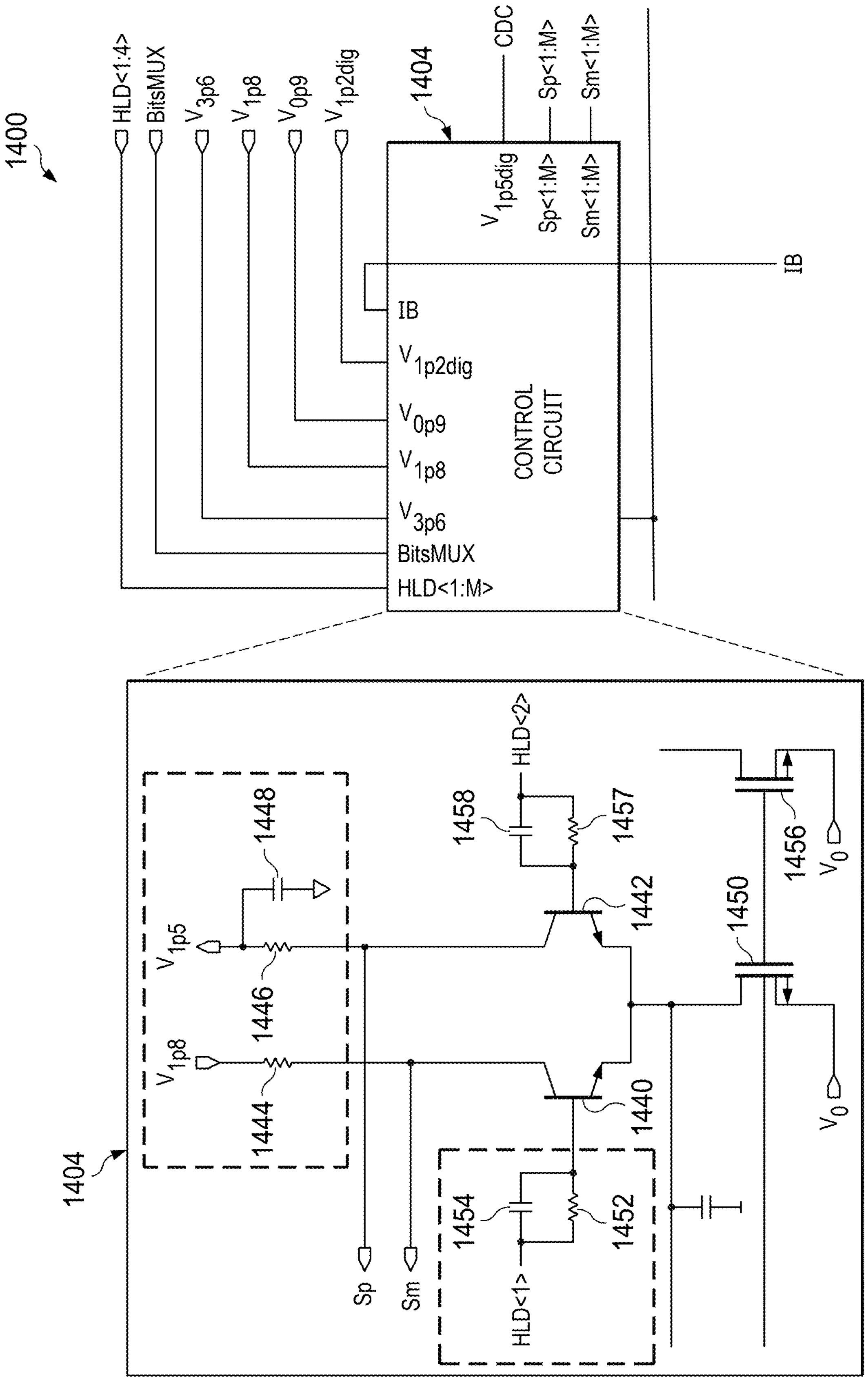

FIG. 14 is a schematic of an example of a multiplexer 1400, which may be an example of multiplexer core 140, multiplexer 250, or multiplexer 1300 described above. Multiplexer 1400 shown in FIG. 14 may include an M-way (e.g., 4-way) multiplexer 1402, a control circuit 1404 for generating control signals to control M-way multiplexer 1402, a bias circuit 1406, and an output buffer (which may be an example of output buffer 260). An inset 1405 in FIG. 14 shows one instance of M (e.g., 4) instances in M-way multiplexer 1402 that has M input channels and an output channel. The circuit for each instance as shown in inset 1405 may be a modified version of the integrate-and-hold circuit described above with respect to, for example, FIGS. 4-7, and may have a high linearity, a high speed, and a low leakage/crosstalk between the input channels.

As illustrated, each instance of the M instances in the M-way multiplexer may include a pair of input resistors 1435 and 1436, a pair of transistors 1420 and 1422, a pair of resistors 1428 and 1430 for linearization (e.g., by source/emitter degeneration), a current sink, and a pair of transistor 1434 and 1438 that may be turned on to set the differential input pair to a pre-determined voltage. The current sink may be implemented using a transistor 1432. As described above, transistors 1420 and 1422 may be high speed BJTs or MOSFETs, such as NPN BJTs. The bases/gates of transistors 1420 and 1422 may be coupled to a differential input pair through input resistors 1435 and 1436, respectively. In some examples, input resistors 1435 and 1436 may be replaced or implemented using high speed switches, such as high speed MOSFETs. The emitters/sources of transistors 1420 and 1422 may be coupled to resistors 1428 and 1430 for emitter degeneration to improve linearity as described above with respect to, for example, FIG. 4 or 6. The collectors/drains of transistors 1420 and 1422 may be coupled to the shared output (e.g., a transmission line) and can provide a differential current signal at the collectors/drains. Resistors 1428 and 1430 may be coupled to the current sink that provides a bias current. In addition, a neutralization capacitor may be coupled between the base/gate of transistor 1420 and the collector/drain of transistor 1422, and another neutralization capacitor may be coupled between the base/gate of transistor 1422 and the collector/drain of transistor 1420. In the illustrated example, the neutralization capacitors may be implemented using transistors 1424 and 1426. For example, the base of transistor 1424 may be coupled to the base/gate of transistor 1420, the collector of transistor 1424 may be coupled to the collector of transistor 1422, and the emitter of transistor 1424 may be left floating. Similarly, the base of transistor 1426 may be coupled to the base/gate of transistor 1422, the collector of transistor 1426 may be coupled to the collector of transistor 1420, and the emitter of transistor 1426 may be left floating. As described above, the neutralization capacitors may cancel or reduce the coupling and charge injection from the base/gate of transistor 1420 (or transistor 1422) to the collector/drain of transistor 1420 (or transistor 1422) due to the parasitic capacitance between the base and collector (or between gate and drain) of a transistor, thereby reducing undesired coupling from an unselected input to the output of the multiplexer.

During the operation of multiplexer 1400, when an input channel is selected to connect to the output of the multiplexer, transistors 1420, 1422, and 1432 for the selected channel may be activated, and transistors 1434 and 1438 for the selected channel may be turned off. Therefore, the differential input may be passed to the output through transistors 1420 and 1422 (e.g., with a gain of 1). In the circuits for other input channels that are not selected, transistors 1432 may be deactivated and transistors 1434 and 1438 may be turned on. Therefore, the input may be connected by transistors 1434 and 1438 to a voltage source (e.g., a 0.9V supply represented by V0p9) and set to a certain DC voltage level (e.g., the input common-mode voltage). Also, with transistors 1432 may be disabled, and the bias current may be stopped. With the input set to a pre-determined voltage level and the bias current disabled, transistors 1420 and 1422 can be disabled. Such arrangements can speed up the deactivation of transistors 1420 and 1422 due to the voltage and current changes in both the bases (or gates) and the emitters (or sources) of transistors 1420 and 1422. Setting the input to a pre-determined voltage level by transistors 1434 and 1438 may also reduce the undesired coupling from the input to the output. The undesired coupling from the input to the output may be further reduced by the neutralization capacitors as describe above. Therefore, high speed, high linearity, and low crosstalk multiplexing may be achieved using the combination of the techniques described above.

In some examples, to further improve the speed, linearity, and channel isolation, the signal levels of the control signals for controlling the switching of the transistors (e.g., transistors 1432, 1434, and 1438) may be adjusted for more synchronized and faster switching of the transistors. For example, the collectors of transistors 1432 and 1434 (and 1438) may have different voltage levels, and thus it may be desirable that the control signals applied to the bases of transistors 1432 and 1434 (and 1438) have different voltage levels (e.g., different high levels) or swings to achieve similar switching profiles. In the illustrated example, a differential buffer with different power supply voltages may be used to generate signals with similar swings but different DC offsets to control transistors 1432 and 1434 (and 1438), thereby achieving similar switching conditions at transistors 1432 and 1434 (and 1438). For example, control circuit 1404 may include a pair of transistors 1440 and 1442 that may receive control signals having the same swing and the same DC offset to generate control signals having similar swings but different DC offsets. Control circuit 1404 may include a current source 1450 for providing a bias current, and a pair of resistors 1444 and 1446 that may have the same resistance but are coupled to different supply voltages. The sink current of current source 1450 may be set using a current mirror that also includes a current source 1456. Each of resistors 1444 and 1446 may be coupled between a supply voltage and the collector/drain of transistor 1440 or 1442. A decoupling capacitor 1448 may be used for decoupling a supply voltage that may be locally generated. Due to the different supply voltages and similar currents passing through transistors 1440 and 1442, the voltage levels at the collectors/drains of transistors 1440 and 1442 may have similar swings but different DC offsets. The collectors/drains of transistors 1440 and 1442 may be coupled to the bases/gates of transistors 1434 (or 1438) and 1432, respectively, to control the corresponding transistors.

In some examples, transistors 1440 and 1442 may include MOSFETs and may achieve fast switching. In some examples, control circuit 1404 may not include MOSFETs, for example, due to process limitations or incompatibility between bipolar and MOS transistors. To improve the switching speed of the bipolar transistors, the input to the bipolar transistors may include both a DC path (e.g., through a resistor 1452 or 1457) and an AC path (e.g., through a capacitor 1454 or 1458). The DC path may be used to provide a large-signal steady response, but may have a slow response for high speed switching. The AC path of the input to the bipolar transistor can help to improve the switching speed and slew rate of the control signals generated by control circuit 1404, without disturbing the large-signal response.

The output buffer of multiplexer 1400 may include, for example, transistors 1408 and 1410, resistors 1412 and 1414, a decoupling capacitor 1418, and a switch 1416. Transistors 1408 and 1410 are cascode devices to buffer the differential current signal provided by transistors 1420 and 1422, and the differential current signal can form a differential voltage signal via a combination of resistors 1412 and 1414 and the resistances of the cascode devices at terminals $V_{gainP}$ and $V_{gainM}$. The cascode devices also increase the resistance at terminals $V_{gainP}$ and $V_{gainM}$ and increase signal amplification. Switch 1416 can be a high voltage switch to mitigate a second-order-effect related to safely powering on the circuit given real-life limitations of safe transistors voltages levels (of the high speed transistors 1408, 1410 for example) and potential edge cases outside of the nominal operating conditions. Transistors 1408 and 1410 may be in the common-base (or common-gate) configuration. The bases/gates of transistors 1408 and 1410 may be driven by a bias current. The emitters/sources of transistors 1408 and 1410 may be coupled to the output of M-way multiplexer 1402. The collectors/drains of transistors 1408 and 1410 may be coupled to resistors 1412 and 1414, respectively. The collectors/drains of transistors 1408 and 1410 (terminals $V_{gainP}$ and $V_{gainM}$) may be coupled to a buffer, such as output buffer 1306.

As described above, because of the high linearity and high operating speed of the integrate-and-hold circuits disclosed herein, the integrate-and-hold circuits may also be used as the sampling circuits in time-interleaved high-speed ADCs. Each integrate-and-hold core described above may integrate the input signal during an integrate phase and hold the integrated signal for one or more integrate phases, during which the integrated signal may be converted to a digital signal by an ADC and the input signal may be integrated by one or more other integrate-and-hold circuits. The integrated signals generated by the one or more other integrate-and-hold circuits may be converted into digital signals by one or more other ADCs while the integrated signals are held by the one or more other integrate-and-hold circuits. The digital signals from the ADCs may be output to one or more serial channels or a parallel bus using, for example, a digital multiplexer, a serializer, high-speed digital drivers, or a combination thereof.

Figure 15:
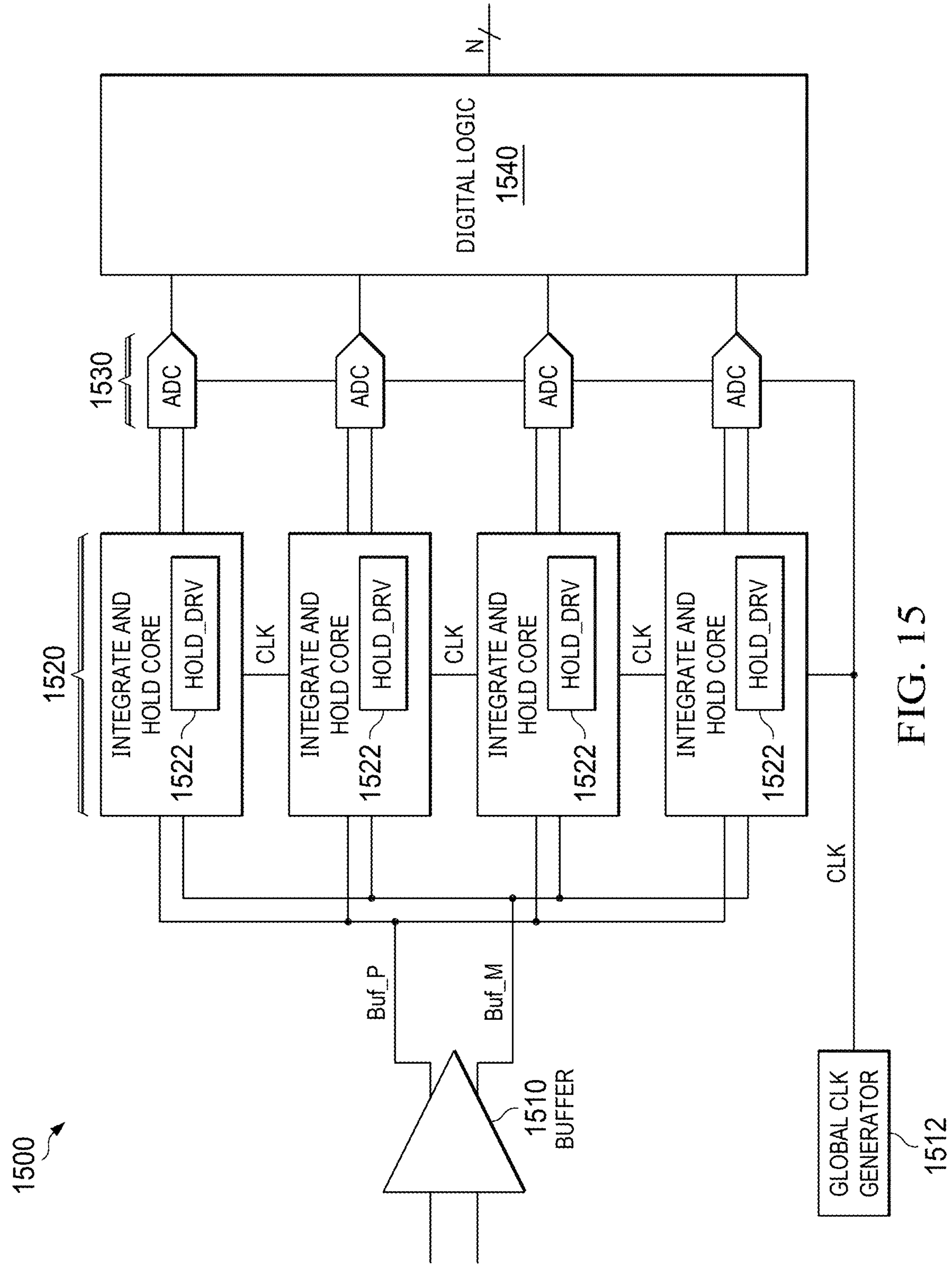
FIG. 15 is a block diagram of an example of a time-interleaved analog-to-digital converter (ADC).

FIG. 15 is a block diagram of an example of a time-interleaved ADC 1500 that may include the integrate-and-hold circuits disclosed herein and may achieve a high linearity at a high sampling/conversion rate. Time-interleaved ADC 1500 may include a input buffer 1510 that may receive an analog input signal and distribute the analog input signal to a plurality of integrate-and-hold cores 1520. In some examples, input buffer 1510 may perform certain signal conditioning on the analog input signal, such as, for example, low-noise amplification, lowpass or bandpass filtering, single-end to differential conversion, and the like. Time-interleaved ADC 1500 may also include a clock generator 1512 that may generate a low-jitter clock signal. In one example, clock generator 1512 may be coupled to an external crystal oscillator and may include a clock synthesizer (e.g., a phase locked loop or delay locked loop) and jitter cleaning circuits. The clock signal generate by clock generator 1512 may be used to control and synchronize the operations of other functional blocks of the time-interleaved ADC 1500, such as integrate-and-hold cores 1520, ADCs 1530, and digital logic 1540 (e.g., including a serializer/deserializer).

Each integrate-and-hold core 1520 may include a integrate-and-hold circuit and control circuits that may generate control signals for controlling the operations of the integrate-and-hold circuit. For example, the control circuits may include a hold driver circuit 1522 for controlling the transitions from the integrate phase to the hold phase and from the clear phase to the integrate phase. Examples of integrate-and-hold core 1520 are described above with respect to, for example, FIGS. 4-7. Examples of the control circuits, such as control circuits for generating the clear signal and the hold signal to control the transitions from the hold phase to the clear phase, from the clear phase (or settling period) to the integrate phase, and from the integrate phase to the hold phase, are described above with respect to, for example, FIGS. 8-10. The integrate-and-hold core 1520 may also include an output buffer that may be similar to or same as buffer 230 or buffer 450. An example of the output buffer may be similar to or same as transmission line buffer 1100 described above with respect to FIG. 11.

The plurality of integrate-and-hold cores 1520 may be synchronized based on the clock signal generated by clock generator 1512 and may be controlled to integrate the analog input signal during different time periods in a round-robin manner. Each integrate-and-hold core 1520 may be coupled to a corresponding ADC 1530 of a plurality of ADCs 1530. ADC 1530 may convert the integrated signal that is held at the integration capacitors into a digital value. While one ADC 1530 is converting the integrated signal held at the integration capacitors of a corresponding integrate-and-hold core, other integrate-and-hold cores 1520*s* may integrate the analog input signal and/or hold the integrated signal. In this way, the plurality of integrate-and-hold cores 1520 may sequentially integrate the analog input signal, and the plurality of ADCs 1530 may sequentially output the converted digital values to digital logic 1540.

Digital logic 1540 may receive the digital values from the plurality of ADCs 1530, arrange the digital values based on the order that the corresponding analog signals are integrated, and send the arranged digital values to one or more output channels. For example, the digital logic 1540 may include a digital multiplexer that selectively couples the outputs of the plurality of ADCs 1530 to a buffer or queue, such that the data in the buffer or queue may be in an order based on the order that the corresponding analog signals are integrated. The data in the buffer or queue may be encoded, converted from parallel to serial if needed, and transmitted to digital data processing or storage circuits using one or more digital drivers, such as one or more differential drivers.

Figure 16:
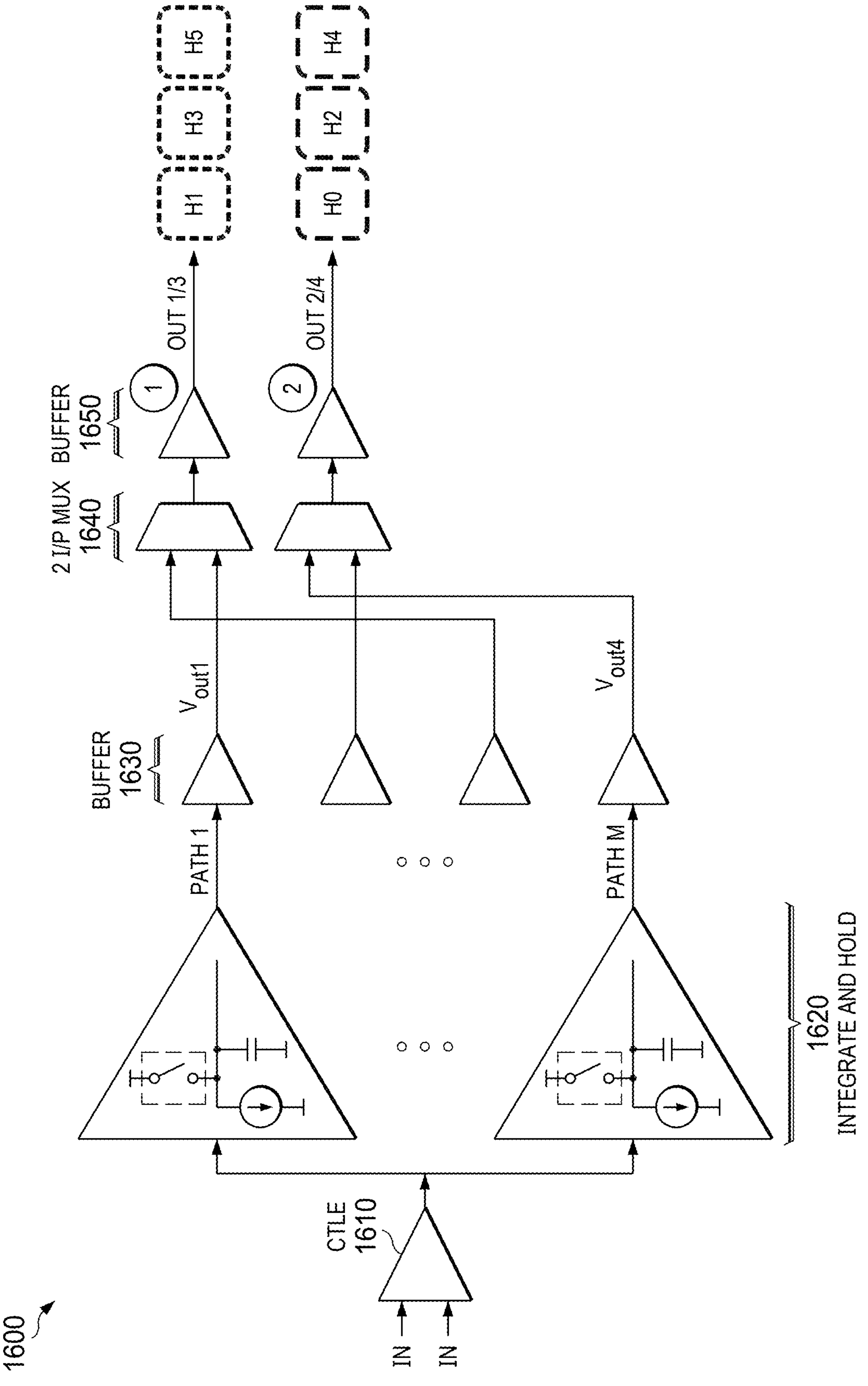
FIG. 16 is a block diagram of an example of a time-interleaved ADC.

FIG. 16 is a block diagram of an example of a time-interleaved ADC 1600. Time-interleaved ADC 1600 may be an example of time-interleaved ADC 1500 described above. In the illustrated example, time-interleaved ADC 1600 may include an input buffer (e.g., including a CTLE 1610), a plurality of integrate-and-hold cores 1620, a plurality of buffers 1630, and optionally a plurality of multiplexers 1640 and a plurality of output buffer 1650. Each multiplexer 1640 can be a 2-to-1 MUX coupled to the outputs of two instances of integrate-and-hold cores 1620, and can be controlled to selectively connect the output of one of the instances of integrate-and-hold cores 1620 that is in hold phase to buffer 1650. For example, an instance of multiplexer 1640 can selectively pass one of output $V_{out1}$ of the first integrate-and-hold core or output $V_{out3}$ of the third integrate-and-hold core to the output of a first output buffer 1650 (labelled OUT 1/3), another instance of multiplexer 1640 can selectively pass one of output $V_{out2}$ of the second integrate-and-hold core or output $V_{out4}$ of the fourth integrate-and-hold core to the output of a second output buffer 1650 (labelled OUT 2/4). Accordingly, each multiplexer 1640 can provide a de-interleaving function. Such arrangements can avoid providing unsettled data of integrate-and-hold cores 1620, when the integrate-and-hold core is in the clear or integrate phases, to buffer 1650, and reduce the number of output channels by half. In some examples, ADC 1600 can be a D-way de-interleave ADC with D=2 outputs, with N=D+2=4 integrate-and-hold cores 1620, with two clock cycles for integrate and clear phases. In a case where there are four outputs (D=4), there can be N=D+2=6 integrate-and-hold cores 1620.

CTLE 1610 may be coupled to an input port of time-interleaved ADC 1600. The input port may be a differential input port and may receive a differential analog input signal having a bandwidth of, for example, a few gigahertz, a few tens of gigahertz, or higher. The output of CTLE 1610 may be coupled to the plurality of integrate-and-hold cores 1620. Each integrate-and-hold core 1620 may be coupled to a corresponding buffer 1630 of a plurality of buffers 1630. The output of each buffer 1630 may include previously integrated signals that are being cleared and thus may not be stable during some periods (e.g., clear phases). The output of each buffer 1630 may also include analog input signals that are being integrated and thus may not be stable during some periods (e.g., integrate phases). The output of each buffer 1630 may also include stable integrated signals that are being held during some periods (e.g., hold phases). In some examples, an ADC may be controlled to only convert the stable integrated signals that are being held during the hold phases and may discard received signals that are signals in the clear phases or integrate phases.

In some examples, the output of each buffer 1630 may be coupled to two or more multiplexers 1640 (e.g., two in the illustrated example), and each multiplexer 1640 may receive outputs from two or more buffers 1630 and send the outputs from the two or more buffers 1630 onto an output channel driven by a buffer 1650 of the plurality of buffers 1650. The data on the output channel may include alternating outputs from the two or more buffers 1630. For example, when a first integrate-and-hold circuit is in the hold phase, the integrated signal held by the first integrate-and-hold circuit may be output to the first output channel. When the first integrate-and-hold circuit is in the clear phase or integrate phase, the integrated signal held by another (e.g., the third) integrate-and-hold circuit may be output to the first output channel. In this way, the output signals on an output channel may not include unsettled signals that are signals associated with the clear phases or the integrate phases.

Some of these components of time-interleaved ADC 1600 may be similar to components of linear retimer 200 described above. For example, CTLE 1610 may be similar to CTLE 210, but may not include a CDR circuit. Integrate-and-hold cores 1620 may be similar to integrate-and-hold cores 220. Examples of integrate-and-hold cores 1620 (including the control circuits) are described above with respect to, for example, FIGS. 4-10. Buffers 1630 may be similar to buffers 230. An example of buffers 1630 may be similar to or same as transmission line buffer 1100 described above with respect to FIG. 11. Multiplexers 1640 may be similar to multiplexer 250. An example of multiplexers 1640 may be similar to or same as multiplexer 1300 or 1400 described above with respect to FIGS. 13-14. Output buffer 1650 may be similar to output buffer 260.

As described above, CTLE 1610 may be a filter that can attenuate low-frequency signal components, boost components at high frequencies (e.g., around the Nyquist frequency), and/or filter out higher frequency components, such that frequency components in a band of interest may have the same or similar attenuation or amplification to achieve channel equalization, while frequency components outside of the band of interest may be filtered out. CTLE 1610 may be formed using passive components or active components. In some examples, CTLE 1610 may include one or more high-pass filters to boost the high frequency components of the received signal. The gain of CTLE 1610 may be adjusted to balance the low frequency attenuation and high frequency amplification. In some examples, CTLE 1610 may include two or more stages to achieve the desired boost factor and gain bandwidth.

Each integrate-and-hold core 1620 may integrate the analog input signal (e.g., output signal of CTLE 1610) over an integrate phase and hold the integrated signal for a hold phase to generate a signal sample in each integrate-and-hold cycle. At the beginning of each integrate-and-hold cycle, the signal integrated and held during the previous integrate-and-hold cycle may be cleared by, for example, shorting the two terminals of each integration capacitor during a clear phase. In one example, the clear phase may be one clock cycle. In some examples, the clear phase may be a half of a clock cycle, and the integration capacitors may be allowed to settle for a time period (e.g., the other half of the clock cycle) after the clear phase. After the signal integrated and held during the previous integrate-and-hold cycle is cleared and the voltage levels of the signal stored in the integration capacitors are settled (e.g., to 0 V across each integration capacitor), the analog input signal may be integrated during the integrate phase by, for example, charging or discharging the integration capacitors, where the current for charging or discharging the integration capacitors may be a linear function to the input signal (e.g., the two single-end signals of a differential signal). In one example, the integrate phase may be one clock cycle. After a predetermined integrate phase, the charging or discharging of the integration capacitors may stop, and the voltage signal stored in the integration capacitors may be held during the hold phase. The hold phase can include one or more clock cycles, such as two or more clock cycles. As described above with respect to, for example, FIGS. 4-10, each integrate-and-hold core 1620 may include analog circuits and control/drive circuits designed to achieve high bandwidth and high linearity integrate-and-hold.

Because time-interleaved ADC 1600 includes a plurality of integrate-and-hold cores 1620, different integrate-and-hold cores 1620 may integrate and hold the analog input signal during different time periods, such as taking turns to integrate and hold the analog input signal in a round-robin manner. When one integrate-and-hold core 1620 is in the hold phase, one or more other integrate-and-hold cores 1620 may be in the integrate phase or clear phase. The hold phase may be pre-determined based on, for example, the conversion rate of each ADC of the time-interleaved ADC. The number of integrate-and-hold cores 1620 in time-interleaved ADC 1600 may be determined based on, for example, the hold phase, the overall sampling rate of the time-interleaved ADC, the integration time of each integrate-and-hold core 1620, and the like. For example, when there are M integrate-and-hold cores 1620 in the time-interleaved ADC and each integrate-and-hold core 1620 may integrate the analog input signal in one clock cycle, each integrate-and-hold core 1620 may hold the integrated signal for M-2 clock cycles in every M clock cycles. M can be selected such that an ADC can convert one analog sample into a digital value within M-2 clock cycles. In this way, each integrate-and-hold core 1620 may have a sampling rate of f/M, and the M integrate-and-hold cores 1620 may have an overall sampling rate f, where f may be the clock frequency.

Each integrate-and-hold core 1620 may include a clear signal generation circuit that may generate a clear signal to control the clearing of the integrated signal from the previous cycle as described above with respect to FIG. 8. Each integrate-and-hold core 1620 may also include a hold control circuit that may generate a hold control signal for controlling the operations of integrate-and-hold core 120, such as the transitions from the integrate phase to the hold phase and from the clear phase (or settling period) to the integrate phase. The output of each integrate-and-hold core 1620 may be a differential signal. The differential output of each integrate-and-hold core 1620 may be coupled to a respective buffer 1630 (e.g., a differential buffer).

Each buffer 1630 may have an effective input impedance that may match the impedance of the transmission line between the output of each integrate-and-hold core 1620 and buffer 1630 as described above with respect to FIG. 11, such that the transmission line may be properly terminated to reduce reflections that may otherwise be caused by impedance mismatch. For example, the buffer may include termination resistors at the input to achieve a target input impedance. In some examples, each buffer 1630 may be coupled to an ADC core, which may convert the integrated analog signal samples into digital signals.

As shown in FIG. 16, in some examples, the output of each buffer 1630 may be coupled to two or more multiplexers 1640 (e.g., two in the illustrated example), and each multiplexer 1640 may receive outputs from two or more buffers 1630 and send the outputs from the two or more buffers 1630 onto an output channel driven by a buffer 1650 of the plurality of buffers 1650, such that the signals on the output channel may not include unsettled signals from the clear phases and integrate phase. Each multiplexer may include circuits as described above with respect to, for example, FIGS. 13 and 14.

Figure 17:
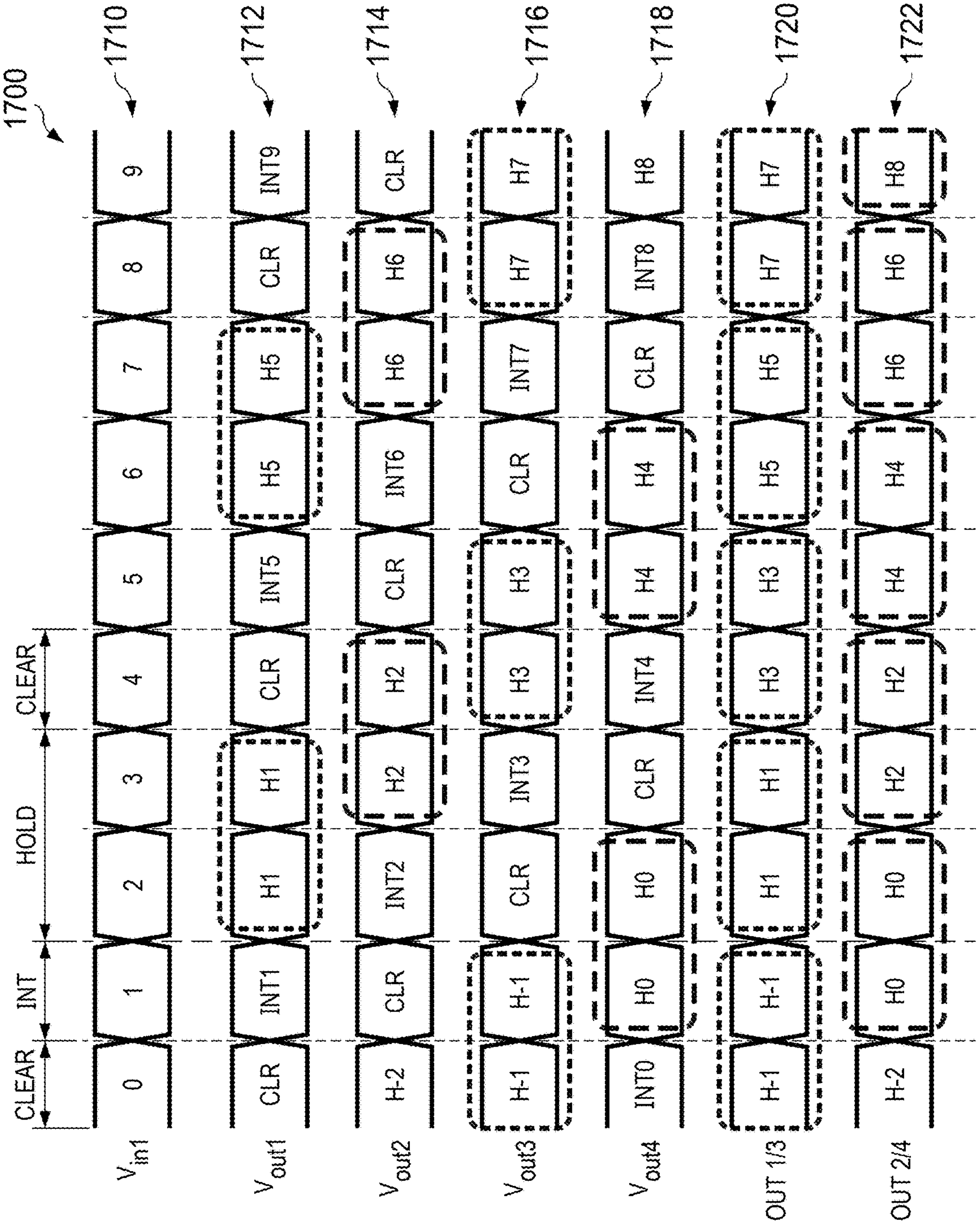
FIG. 17 is a diagram illustrating operations of a plurality of integrate-and-hold circuits of an example of a time-interleaved ADC.

FIG. 17 is a diagram 1700 illustrating operations of a plurality of integrate-and-hold cores of an example of a time-interleaved ADC, such as time-interleaved ADC 1600. A diagram 1710 shows the time frames (e.g., clock cycles or integrate phases) of an example of an analog input signal $V_{in}$ at an input port of the time-interleaved ADC, such as the input port of CTLE 1610 of time-interleaved ADC 1600. Diagrams 1712, 1714, 1716, and 1718 show examples of outputs of a plurality of integrate-and-hold cores, such as outputs at buffers 1630. Diagrams 1720 and 1722 show examples of outputs of buffers 1650. In the illustrated example, the time-interleaved ADC includes four integrate-and-hold cores that may integrate and hold the analog input signal $V_{in}$ in a round-robin manner. Each integrate-and-hold core may clear the previously integrated signal within one time frame (e.g., one clock cycle or one integrate phase), integrate the analog input signal for one time frame, and hold an integrated signal for two time frames. As describe above, in other examples, an integrated signal may be held for more than 2 time frames, and the ADC may include more than four interleaved integrate-and-hold cores. The numbers in diagram 1710 also denote time periods.

In time frame 2, the first integrate-and-hold core (providing $V_{out1}$) may be in the hold phase and has an output value H1, the second and integrate-and-hold core (providing $V_{out2}$) may be in the integrate phase, the third integrate-and-hold core (providing $V_{out3}$) may be in the clear phase, and the fourth integrate-and-hold core (providing $V_{out4}$) may be in the hold phase and has an output value H0. A first multiplexer can selectively provide the output value H1 of the first integrate-and-hold core ($V_{out1}$) to a first output buffer (e.g., a buffer 1650), such that the first output buffer may provide the output value H1 of the first integrate-and-hold core to output OUT 1/3 of the first output buffer. A second multiplexer can selectively provide the output value H0 of the fourth integrate-and-hold core ($V_{out4}$) to a second output buffer (e.g., another buffer 1650), such that the second output buffer may provide the output value H0 of the fourth integrate-and-hold core to output OUT 2/4 of the second output buffer.

In time frame 3, the first integrate-and-hold core may still be in the hold phase and has an output value H1, the second integrate-and-hold core may be in the hold phase and has an output value H2, the third integrate-and-hold core may be in the integrate phase, and the fourth integrate-and-hold core may be in the clear phase. The first multiplexer can selectively provide the output value H1 of the first integrate-and-hold core ($V_{out1}$) that is in the hold phase to the first output buffer, such that the first output buffer may provide the output value H1 of the first integrate-and-hold core to output OUT 1/3 of the first output buffer. The second multiplexer can selectively provide the output value H2 of the second integrate-and-hold core ($V_{out2}$) that is in the hold phase to the second output buffer, such that the second output buffer may provide the output value H2 of the second integrate-and-hold core to output OUT 2/4 of the second output buffer.

In time frame 4, the first integrate-and-hold core may be in the clear phase, the second integrate-and-hold core may be in the hold phase and has an output value H2, the third integrate-and-hold core may be in the hold phase and has an output value H3, and the fourth integrate-and-hold core may be in the integrate phase. The first multiplexer can selectively provide the output value H3 of the third integrate-and-hold core ($V_{out3}$) that is in the hold phase to the first output buffer, such that the first output buffer may provide the output value H3 of the third integrate-and-hold core to output OUT 1/3 of the first output buffer. The second multiplexer can selectively provide the output value H2 of the second integrate-and-hold core ($V_{out2}$) that is in the hold phase to the second output buffer, such that the second output buffer may provide the output value H2 of the second integrate-and-hold core to output OUT 2/4 of the second output buffer.

In time frame 5, the first integrate-and-hold core may be in the integrate phase, the second integrate-and-hold core may be in the clear phase, the third integrate-and-hold core may be in the hold phase and has an output value H3, and the fourth integrate-and-hold core may be in the hold phase and has an output value H4. The first multiplexer can selectively provide the output value H3 of the third integrate-and-hold core that is in the hold phase to the first output buffer, such that the first output buffer may provide the output value H3 of the third integrate-and-hold core to output OUT 1/3 of the first output buffer. The second multiplexer can selectively provide the output value H4 of the fourth integrate-and-hold core that is in the hold phase to the second output buffer, such that the second output buffer may provide the output value H4 of the fourth integrate-and-hold core to output OUT 2/4 of the first output buffer.

Figure 18:
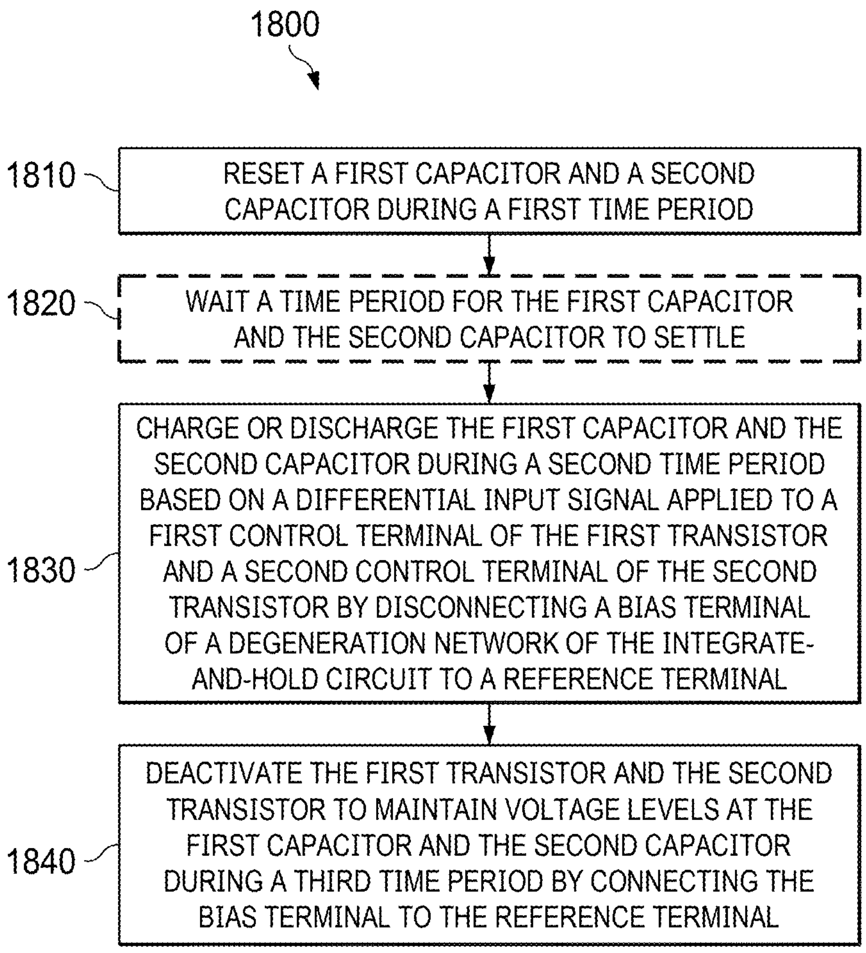
FIG. 18 is flowchart illustrating operations of an example of an integrate-and-hold circuit disclosed herein.

FIG. 18 is flowchart 1800 illustrating a process of operating an example of an integrate-and-hold circuit disclosed herein. Operations in flowchart 1800 may be performed using, for example, integrate-and-hold circuits 400, 600, or 700 described above. The operations in the process may include, at block 1810, turning on a first switch (e.g., switch 626) and a second switch (e.g., switch 628) of an integrated circuit (e.g., integrate-and-hold circuit 600) to clear a first capacitor (e.g. integration capacitor 622) and a second capacitor (e.g. integration capacitor 624) during a first time period (e.g., clear phase). The first switch and the first capacitor may each be coupled between a voltage supply (e.g., VDD1) and a first current input terminal (e.g., the collector or drain) of a first transistor (e.g., transistor 610). The second switch and the second capacitor may each be coupled between the voltage supply and a second current input terminal (e.g., the collector or drain) of a second transistor (e.g., transistor 612). In some examples, turning on the first switch and the second switch may include turning on the first switch and the second switch using a control signal generated based on a gated differential clock signal (e.g., Qp/Qm). The gated differential clock signal may be generated by gating a differential clock signal (e.g., Cp/Cm) using a gating signal (e.g., Dm). Before the first switch and the second switch are turned on, the first transistor and the second transistor may have been deactivated so that the first capacitor and the second capacitor may not be charged or discharged through the first transistor and the second transistor during the clear phase. For example, the first transistor and the second transistor may have been deactivated by biasing the emitters/sources of the first transistor and the second transistor to a high level (e.g., higher than the input signals at the bases/gates of the first transistor and the second transistor). In some examples, the first time period may be about a half of a clock cycle or a half of an integrate phase.

Optionally, at block 1820, after the first time period (e.g., the clear phase), the first switch and the second switch may be turned off, and the integrate-and-hold circuit may wait for a certain time period to allow the first switch, the second switch, the voltage level across the first capacitor, and the voltage level across the second capacitor to settle. The voltage level across the first capacitor and the voltage level across the second capacitor may settle at, for example, about 0 V. During this settling time period, the first transistor and second transistor may remain deactivated. In some examples, a first pedestal current may be supplied to the first current input terminal (e.g., collector or drain) of the first transistor by a first current source, and a second pedestal current may be supplied to the second current input terminal of the second transistor by a second current source. As described above, applying a small pedestal current to the first transistor and the second transistor may set the two transistor to a condition that is close to the linear operating condition, such that, upon activation, the two transistors may be quickly set to the linear operating condition for input signal integration.

Operations in block 1830 may include activating the first transistor and the second transistor to charge or discharge the first capacitor and the second capacitor during a second time period (e.g., integrate phase) based on a differential input signal applied to a first control terminal (e.g., base or gate) of the first transistor and a second control terminal (e.g., base or gate) of the second transistor. As described above, upon activation, the first transistor and the second transistor may be quickly set to the linear operating condition, such that the collector/gain currents of the first transistor and the second transistor may be linear functions of the differential input signal applied to the bases/gates of the first transistor and the second transistor. Therefore, the first capacitor and the second capacitor may be charged or discharged by currents that may be linear functions of the differential input signal. In this way, the differential input signal may be integrated, and the integrated value may be stored in the first capacitor and the second capacitor.

As described above, in some examples, a first parasitic capacitor between the first control terminal and the first current input terminal of the first transistor may be neutralized using a first neutralization capacitor coupled between the second control terminal and the first current input terminal to reduce the undesired charge injection and capacitive coupling between the input and the output of the integrate-and-hold circuit. Similarly, a second parasitic capacitor between the second control terminal and the second current input terminal of the second transistor may be neutralized using a second neutralization capacitor coupled between the first control terminal and the second current input terminal to reduce the undesired charge injection and capacitive coupling between the input and the output of the integrate-and-hold circuit. The neutralization capacitors may be implemented using, for example, diodes or transistors with a floating terminal as shown in FIG. 7.

Operations in block 1840 may include deactivating the first transistor and the second transistor to maintain voltage levels at the first capacitor and the second capacitor during a third time period. Deactivating the first transistor and the second transistor may include applying a bias voltage to a bias terminal (e.g., bias terminal 438, 644, or 744) that is coupled to a first current output terminal (e.g., emitter or source) of the first transistor through at least a first resistor and is coupled to a second current output terminal (e.g., emitter or source) of the second transistor through at least a second resistor. In some examples, the bias terminal may also be coupled to the first current output terminal of the first transistor through an AC path that may include a third resistor and a third capacitor connected in serial, and the bias terminal may also be coupled to the second current output terminal of the second transistor through an AC path that may include a fourth resistor and a fourth capacitor connected in serial. Therefore, an AC bias may be applied to the emitters/source of each of the two transistors to more quickly deactivate/reactivate the two transistors. The bias network may be used for both differential-pair emitter/source degeneration and linear deactivation (or reactivation) of the first transistor and second transistor, and thus may further improve the linearity and speed of the integrate-and-hold circuit.

In some examples, applying the bias voltage to the bias terminal may include generating a hold signal to control a switch that couples the bias voltage to the bias terminal. In some examples, generating the hold signal may include: applying, via a pair of capacitors (e.g., capacitor 1024 and 1032), a differential control signal (e.g., HLD/HLDZ shown in FIG. 10) to control terminals (e.g., bases or gates) of a third transistor (e.g., transistor 1040) and a fourth resistor (e.g., transistor 1042) of a push-pull driver; applying the differential control signal to control terminals (e.g., bases or gates) of a fifth transistor (e.g., transistor 1020) and a sixth transistor (e.g., transistor 1022), where a first terminal (e.g., collector or drain) of the sixth transistor may be coupled to the control terminal of the third transistor of the push-pull driver; and coupling the control signal (e.g., HOLD) at an output terminal (e.g., emitter or source) of the third transistor to a control terminal of a third switch (e.g., a transistor 640) coupled between a bias voltage source (e.g., VDD2) and the bias terminal.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of at least a part of Y and any number of other factors. If an action X is "based on" Y, then the action X may be based at least in part on at least a part of Y.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "on" or "enabled" means that the conduction channel of the FET is present and drain current $I_D$ (or drain-to-source current $I_{DS}$) may flow through the FET. References herein to a FET being "off" or "disabled" means that the conduction channel is not present so drain current does not flow through the FET. An "off" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description.

In this description, unless otherwise stated, "about," "approximately" or "substantially" preceding a parameter means being within +/−10 percent of that parameter or, if the parameter is zero, a reasonable range of values around zero.

Terms "and" and "or," as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean A, B, C, or a combination of A, B, and/or C, such as AB, AC, BC, AA, ABC, AAB, ACC, AABBCCC, or the like.

Although various examples have been described in detail, it should be understood that various changes, substitutions, and alterations can be made therein without departing from the scope defined by the appended claims. The devices, structures, materials, and processes discussed above are examples. Various examples may omit, substitute, or add various procedures or components as appropriate. Also, features described with respect to certain examples may be combined in various other examples. Different aspects and elements of the examples may be combined in a similar manner. Also, technology evolves and, thus, many of the elements are examples that do not limit the scope of the disclosure to those specific examples.

Specific details are given in the description on order to provide a thorough understanding of the examples. However, examples may be practiced without these specific details. For example, well-known circuits, processes, systems, structures, and techniques may have been shown without unnecessary detail in order to avoid obscuring the examples. This description provides examples only, and is not intended to limit the scope, applicability, or configuration of the invention. Rather, the preceding description of the examples will provide those skilled in the art with an enabling description for implementing various examples.

Various changes may be made in the function and arrangement of elements without departing from the spirit and scope of the present disclosure. Modifications are possible in the described examples, and other examples are possible, within the scope of the claims.

What is claimed is:

1. An integrated circuit comprising:

a plurality of integrate-and-hold circuits coupled to a differential input pair, wherein different integrate-and-hold circuits of the plurality of integrate-and-hold circuits are time-interleaved to integrate and hold a differential input signal from the differential input pair during different time periods;

a plurality of analog-to-digital converters (ADCs), each ADC of the plurality of ADCs coupled to at least one integrate-and-hold circuit of the plurality of integrate-and-hold circuits and configured to convert an output signal of the at least one integrate-and-hold circuit into digital data; and a processing circuit coupled to the plurality of ADCs and configured to arrange the digital data from the plurality of ADCs and output the arranged digital data via one or more digital output channels.

2. The integrated circuit of claim 1, wherein each integrate-and-hold circuit of the plurality of integrate-and-hold circuits includes:

a degeneration network having a bias terminal; and a first switch coupled between the bias terminal and a first reference terminal, the first switch configured to, in a hold phase of the integrate-and-hold circuit, connect the bias terminal to the first reference terminal, and outside the hold phase of the integrate-and-hold circuit, disconnect the bias terminal from the first reference terminal.

3. The integrated circuit of claim 2, wherein the integrate-and-hold circuit includes:

a first transistor including a first control terminal and first and second current terminals, the first control terminal coupled to a first input of the differential input pair;

a second transistor including a second control terminal and third and fourth current terminals, the second control terminal coupled to a second input of the differential input pair;

a first capacitor coupled between a second reference terminal and the first current terminal;

a second capacitor coupled between the second reference terminal and the third current terminal;

a second switch coupled across the first capacitor; and a third switch coupled across the second capacitor, wherein the degeneration network includes a first resistor coupled between the second current terminal and the bias terminal, and a second resistor coupled between the fourth current terminal and the bias terminal.

4. The integrated circuit of claim 3, wherein the integrate-and-hold circuit includes:

a third transistor coupled between the third current terminal and a first floating terminal, the third transistor having a third control terminal coupled to the first control terminal; and a fourth transistor coupled between the first current terminal and a second floating terminal, the fourth transistor having a fourth control terminal coupled to the second control terminal.

5. The integrated circuit of claim 3, wherein the integrate-and-hold circuit includes:

a first current source coupled to the first current terminal; and a second current source coupled to the third current terminal, wherein the first current source and the second current source are parts of a current mirror.

6. The integrated circuit of claim 3, wherein the integrate-and-hold circuit includes:

a third resistor and a third capacitor coupled between the second current terminal and the bias terminal; and a fourth resistor and a fourth capacitor coupled between the fourth current terminal and the bias terminal.

7. The integrated circuit of claim 3, wherein the integrate-and-hold circuit includes:

a third resistor and a first current bias circuit between the second current terminal and a ground terminal; and a fourth resistor and a second current bias circuit between the fourth current terminal and the ground terminal, wherein the first current bias circuit and the second current bias circuit are parts of a current mirror.

8. The integrated circuit of claim 3, wherein the integrate-and-hold circuit is configured to, in each integrate-and-hold cycle:

turn on the second switch and the third switch to clear the first capacitor and the second capacitor during a first time period;

activate the first transistor and the second transistor by disabling the first switch to charge or discharge the first capacitor and the second capacitor during a second time period based on the differential input signal applied to the first control terminal of the first transistor and the second control terminal of the second transistor; and deactivate the first transistor and the second transistor by enabling the first switch to maintain voltage levels at the first capacitor and the second capacitor during a third time period.

9. The integrated circuit of claim 1, further comprising an input buffer between the differential input pair and the plurality of integrate-and-hold circuits.

10. The integrated circuit of claim 9, wherein the input buffer includes a continuous-time linear equalizer.

11. An integrated circuit comprising:

a plurality of integrate-and-hold circuits coupled to a differential input pair, wherein different integrate-and-hold circuits of the plurality of integrate-and-hold circuits are time-interleaved to integrate and hold a differential input signal from the differential input pair during different time periods;

a first plurality of buffers coupled to the plurality of integrate-and-hold circuits;

a plurality of multiplexers, each multiplexer of the plurality of multiplexers coupled to two or more buffers of the first plurality of buffers and including a pair of differential outputs; and a second plurality of buffers coupled to pairs of differential outputs of the plurality of multiplexers.

12. The integrated circuit of claim 11, wherein each integrate-and-hold circuit of the plurality of integrate-and-hold circuits includes:

a degeneration network having a bias terminal; and a first switch coupled between the bias terminal and a first reference terminal, the first switch configured to, in a hold phase of the integrate-and-hold circuit, connect the bias terminal to the first reference terminal, and outside the hold phase of the integrate-and-hold circuit, disconnect the bias terminal from the first reference terminal.

13. The integrated circuit of claim 12, wherein the integrate-and-hold circuit includes:

a first transistor including a first control terminal and first and second current terminals, the first control terminal coupled to a first input of the differential input pair;

a second transistor including a second control terminal and third and fourth current terminals, the second control terminal coupled to a second input of the differential input pair;

a first capacitor coupled between a second reference terminal and the first current terminal;

a second capacitor coupled between the second reference terminal and the third current terminal;

a second switch coupled across the first capacitor; and a third switch coupled across the second capacitor, wherein the degeneration network includes a first resistor coupled between the second current terminal and the bias terminal, and a second resistor coupled between the fourth current terminal and the bias terminal.

14. The integrated circuit of claim 13, wherein the integrate-and-hold circuit includes:

a third transistor coupled between the third current terminal and a first floating terminal, the third transistor having a third control terminal coupled to the first control terminal; and a fourth transistor coupled between the first current terminal and a second floating terminal, the fourth transistor having a fourth control terminal coupled to the second control terminal.

15. The integrated circuit of claim 13, wherein the integrate-and-hold circuit includes:

a first current source coupled to the first current terminal; and a second current source coupled to the third current terminal, wherein the first current source and the second current source are parts of a current mirror.

16. The integrated circuit of claim 13, wherein the integrate-and-hold circuit includes:

a third resistor and a third capacitor coupled between the second current terminal and the bias terminal; and a fourth resistor and a fourth capacitor coupled between the fourth current terminal and the bias terminal.

17. The integrated circuit of claim 13, wherein the integrate-and-hold circuit includes:

a third resistor and a first current bias circuit between the second current terminal and a ground terminal; and a fourth resistor and a second current bias circuit between the fourth current terminal and the ground terminal, wherein the first current bias circuit and the second current bias circuit are parts of a current mirror.

18. The integrated circuit of claim 13, wherein the integrate-and-hold circuit is configured to, in each integrate-and-hold cycle:

turn on the second switch and the third switch to clear the first capacitor and the second capacitor during a first time period;

activate the first transistor and the second transistor by disabling the first switch to charge or discharge the first capacitor and the second capacitor during a second time period based on the differential input signal applied to the first control terminal of the first transistor and the second control terminal of the second transistor; and deactivate the first transistor and the second transistor by enabling the first switch to maintain voltage levels at the first capacitor and the second capacitor during a third time period.

19. The integrated circuit of claim 11, further comprising a continuous-time linear equalizer between the differential input pair and the plurality of integrate-and-hold circuits.

20. The integrated circuit of claim 11, wherein each multiplexer of the plurality of multiplexers includes two or more taps, each tap of the two or more taps including:

a first transistor including a first control terminal, a first current terminal, and a second current terminal, the first current terminal coupled to a first output of a pair of differential outputs of the multiplexer;

a second transistor including a second control terminal, a third current terminal, and a fourth current terminal, the third current terminal coupled to a second output of the pair of differential outputs of the multiplexer;

a first resistor between the first control terminal and a first output of a pair of differential outputs of a respective buffer of the two or more buffers of the first plurality of buffers;

a first switch between a first bias voltage and the first control terminal;

a second resistor between the second control terminal and a second output of the pair of differential outputs of the respective buffer of the two or more buffers of the first plurality of buffers;

a second switch between the first bias voltage and the second control terminal;

a third resistor between the second current terminal and a bias terminal;

a fourth resistor between the fourth current terminal and the bias terminal; and a third switch coupled between the bias terminal and a first current biasing circuit.

21. The integrated circuit of claim 20, wherein each tap of the two or more taps includes:

a first capacitive device coupled between the first control terminal and the third current terminal; and a second capacitive device coupled between the second control terminal and the first current terminal.

22. The integrated circuit of claim 20, wherein the multiplexer includes a control circuit configured to generate control signals for controlling the first switch, the second switch, and the third switch, the control circuit including:

a third transistor including a third control terminal, a fifth current terminal, and a sixth current terminal, the fifth current terminal coupled to control terminals of the first switch and the second switch;

a fourth transistor including a fourth control terminal, a seventh current terminal, and an eighth current terminal, the seventh current terminal coupled to a control terminal of the third switch;

a fifth resistor between the fifth current terminal and a second bias voltage;

a sixth resistor between the seventh current terminal and a third bias voltage; and a second current biasing circuit coupled to the sixth current terminal and the eighth current terminal.

23. The integrated circuit of claim 22, wherein the control circuit further comprises:

a seventh resistor between the third control terminal and a first control input;

a first capacitor coupled between the third control terminal and the first control input;

an eighth resistor coupled between the fourth control terminal and a second control input; and a second capacitor coupled between the fourth control terminal and the second control input.

24. The integrated circuit of claim 11, further comprising:

a plurality of analog-to-digital converters (ADCs), each ADC of the plurality of ADCs coupled to a respective buffer of the second plurality of buffers and configured to convert an output signal of the respective buffer into digital data; and a digital circuit coupled to the plurality of ADCs and configured to arrange the digital data from the plurality of ADCs and output the arranged digital data via one or more digital output channels.

25. The integrated circuit of claim 24, wherein the digital circuit includes at least one of a digital multiplexer or a serialize/deserializer circuit.

* * * * *